(12) United States Patent
Asai et al.

(10) Patent No.: US 6,762,359 B2
(45) Date of Patent: Jul. 13, 2004

(54) PHOTOVOLTAIC PANEL AND METHOD OF PRODUCING SAME

(75) Inventors: Koichi Asai, Nagoya (JP); Yasuo Muto, Chiryu (JP); Kazuya Suzuki, Toyota (JP); Kazutoshi Sakai, Nagoya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 75 days.

(21) Appl. No.: 10/029,998

(22) Filed: Dec. 31, 2001

(65) Prior Publication Data

US 2002/0109957 A1 Aug. 15, 2002

(30) Foreign Application Priority Data

Jan. 15, 2001 (JP) .................................... 2001-006543
Jan. 15, 2001 (JP) .................................... 2001-006544

(51) Int. Cl.⁷ .......................................... H01L 31/0352
(52) U.S. Cl. .................. 136/250; 136/256; 257/461; 257/465; 257/466; 438/63; 438/98
(58) Field of Search .................... 136/250, 256; 257/461, 465, 466; 438/63, 98

(56) References Cited

U.S. PATENT DOCUMENTS

| | | | | |
|---|---|---|---|---|
| 2,904,613 A | * | 9/1959 | Paradise | 136/250 |
| 3,025,335 A | * | 3/1962 | Ralph | 136/250 |
| 3,040,416 A | * | 6/1962 | Matlow et al. | 136/250 |
| 3,247,477 A | * | 4/1966 | Fridrich | 136/250 |
| 3,847,758 A | * | 11/1974 | Te Velde | 136/250 |
| 3,998,659 A | | 12/1976 | Wakefield | |
| 4,136,436 A | * | 1/1979 | Kilby et al. | 136/250 |
| 4,721,649 A | | 1/1988 | Belisle et al. | |
| 5,468,304 A | | 11/1995 | Hammerbacher | |
| 6,399,412 B1 | * | 6/2002 | Asai et al. | 438/63 |
| 6,528,717 B2 | * | 3/2003 | Asai et al. | 136/250 |
| 6,620,997 B2 | * | 9/2003 | Kyoda et al. | 136/250 |

FOREIGN PATENT DOCUMENTS

| JP | 64-84467 | 3/1989 |
|---|---|---|
| JP | 3-76273 A | 4/1991 |
| JP | 6-13633 A | 1/1994 |
| JP | 7-335925 A | 12/1995 |

OTHER PUBLICATIONS

U.S. application Ser. No. 09/711,516 (Asai et al) filed Nov. 14, 2000.

* cited by examiner

*Primary Examiner*—Alan Diamond
(74) *Attorney, Agent, or Firm*—Oliff & Berridge, PLC

(57) ABSTRACT

A method of producing a photovoltaic panel, including the steps of producing a light-transmitting, photovoltaic-element holding member which holds, along a reference surface, a plurality of photovoltaic elements each of which includes a P-type layer and an N-type layer, and forming, on one of opposite sides of the photovoltaic-element holding member, a first electrode which is electrically connected to the respective P-type layers of the photovoltaic elements, and a second electrode which is electrically connected to the respective N-type layers of the photovoltaic elements.

24 Claims, 24 Drawing Sheets

PHOTOVOLTAIC PANEL AND METHOD OF PRODUCING SAME

BACKGROUND OF THE INVENTION

1. Field of the Invention

The present invention relates to a photovoltaic panel and a method of producing a photovoltaic panel.

2. Discussion of Related Art

Japanese patent document No. 7(1995)-335925 discloses a photovoltaic panel including (a) a transparent, plate-like member including a plurality of photovoltaic elements each of which has a P-N junction between its core portion and its shell portion; (b) a first electrode which is provided on one of opposite sides of the plate-like member and which is electrically connected to the respective shell portions of the photovoltaic elements; and (c) a second electrode which is provided on the other side of the plate-like member and which is electrically connected to the respective core portions of the photovoltaic elements.

The photovoltaic panel disclosed in the above-indicated document receives light on the above-indicated other side of the plate-like member where the second electrode does not fully cover the plate-like member. Since the second electrode does not fully cover a light receiving surface of the plate-like member, light can be incident to the light receiving surface of the plate-like member.

However, the photovoltaic panel disclosed in the above-indicated document has the problem that the second electrode only partly covers the light receiving surface of the plate-like member, i.e., that the light receiving area of the panel is decreased by the provision of the second electrode and accordingly the light incident to the panel cannot be efficiently utilized by the panel.

Japanese patent document No. 7(1995)-335925, indicated above, discloses a photovoltaic-panel producing method including (a) a photovoltaic-element-holding-member forming step of forming a light-transmitting, plate-like member holding a number of photovoltaic elements and (b) an electrode forming step of forming electrodes which are electrically connected to the photovoltaic elements held by the photovoltaic-element holding member formed in the photovoltaic-element-holding-member forming step. In the photovoltaic-element-holding-member forming step of the photovoltaic-panel producing method, the photovoltaic-element holding member is produced by first applying a light-transmitting resin to the photovoltaic elements fixed at respective predetermined positions on a substrate and subsequently curing the resin.

It is therefore an object of the present invention to make it possible to utilize more efficiently light incident to a photovoltaic panel.

It is another object of the present invention to make it possible to produce more easily a photovoltaic-element holding member than the photovoltaic-panel producing method disclosed in the above-indicated document does.

The above object may be achieved according to any one of the following features of the present invention in the form of a photovoltaic panel and a photovoltaic-panel producing method. Each of the following features of the present invention is numbered like the appended claims and depends from the other feature or features, where appropriate, to indicate and clarify possible combinations of technical features. It is to be understood that the present invention is not limited to the technical features or any combinations thereof that will be described for illustrative purposes only. It is to be further understood that a plurality of elements included in any one of the following features of the invention are not necessarily provided all together, and that the invention may be embodied without some of the elements described with respect to each feature.

(1) A method of producing a photovoltaic panel, comprising the steps of:

producing a light-transmitting, photovoltaic-element holding member which holds, along a reference surface, a plurality of photovoltaic elements each of which includes a P-type layer and an N-type layer, and forming, on one of opposite sides of the photovoltaic-element holding member, a first electrode which is electrically connected to the respective P-type layers of the photovoltaic elements, and a second electrode which is electrically connected to the respective N-type layers of the photovoltaic elements. The reference surface may be a plane surface or a curved surface. The photovoltaic-element holding member may have a generally plate-like shape.

In the photovoltaic-panel producing method according to this feature, the photovoltaic-element holding member holding the photovoltaic elements is produced, and both the first electrode electrically connected to the P-type layers and the second electrode electrically connected to the N-type layers are provided on one of opposite sides of the holding member. That is, neither of the first and second electrodes is provided on the other side of the holding member. Therefore, in the case where the holding member has a light receiving surface on the other side thereof, the photovoltaic panel can efficiently utilize the light incident thereto, without needing to decrease the light receiving area thereof.

(2) A method according to the first feature (1), wherein the step of producing comprises producing a light-transmitting member which has, along the reference surface, a plurality of photovoltaic-element holding portions, and holding, with the photovoltaic-element holding portions, the photovoltaic elements, respectively.

The photovoltaic-element holding portions may comprise recesses which are formed in a photovoltaic-element holding surface of a photovoltaic-element holding plate, and those recesses may be formed either mechanically using, e.g., a drill, or chemically.

The photovoltaic-element holding portions may be provided at a predetermined, regular interval of distance. If the distance between each pair of holding portions adjacent to each other is too great, a density of the photovoltaic elements may be too low; and if the distance is too small, a power-generating efficiency of each photovoltaic element may be too low. Thus, the distance is predetermined in view of those factors.

An adhesive may be used to fix the photovoltaic elements to the photovoltaic-element holding portions. In this case, the adhesive is one which can transmit light in its cured state. Alternatively, the photovoltaic elements may be fitted in, and fixed to, the photovoltaic-element holding portions. In the latter case, it is preferred that receiving holes as the holding portions have a size which is somewhat smaller than that of the photovoltaic elements.

(3) A method according to the first or second feature (1) or (2), the step of producing comprises forming a light-transmitting layer of a light-transmitting material before curing, embedding at least respective portions of the photovoltaic elements in the light-transmitting layer, and curing the light-transmitting layer in a state in which the at least respective portions of the photovoltaic elements are embedded in the light-transmitting layer.

In the photovoltaic-panel producing method according to this feature, the light-transmitting layer is formed, and subsequently at least respective portions of the photovoltaic elements are embedded in the light-transmitting layer. Then, the light-transmitting layer is cured to form the photovoltaic-element holding member.

The light-transmitting layer before curing has physical properties which assure that respective portions of the photovoltaic elements are embedded in the layer, in other words, properties which maintain the state in which the respective portions of the photovoltaic elements are embedded in the layer. In many cases, the light-transmitting layer is in a half-solid (or gel) state, but in some cases, it is in a liquid state. That the light-transmitting layer is in a state in which the photovoltaic elements can be embedded therein may be expressed in terms of a viscosity, or an elasticity, of the light-transmitting layer.

The light-transmitting layer needs to have physical properties which assure that respective portions of the photovoltaic elements are embedded therein, just at the time when the embedding step is carried out. However, when the light-transmitting layer is initially formed, the layer may have other physical properties. For example, the layer which has just been formed may have so low a viscosity that the layer cannot maintain a state in which respective portions of the photovoltaic elements are embedded therein.

When the light-transmitting layer in a state in which respective portions of the photovoltaic elements are embedded therein is cured, the layer can hold the photovoltaic elements. If at least respective portions of the photovoltaic elements are embedded in the layer, the layer can hold the elements. The photovoltaic elements may be entirely embedded in the layer. However, if the elements are not entirely embedded and are partly exposed, the electrodes can be formed easily.

(4) A method according to the third feature (3), wherein the step of embedding comprises temporarily holding, with a temporarily holding surface of a temporarily holding member, the photovoltaic elements, and moving the temporarily-holding member holding the photovoltaic elements, toward the light-transmitting layer, till the respective portions of the photovoltaic elements are embedded in the light-transmitting layer.

In the photovoltaic-panel producing method according to this feature, the temporarily holding surface of the temporarily holding member holds the photovoltaic elements, and the temporarily-holding member holding the photovoltaic elements is moved toward the light-transmitting layer, so that at least respective portions of the photovoltaic elements are embedded in the light-transmitting layer. That is, the photovoltaic elements are embedded in the light-transmitting layer, not directly, but indirectly using the temporarily-holding member. In some cases, the photovoltaic elements can be more easily embedded in the light-transmitting layer before curing, if the elements are temporarily held by the temporarily holding surface of the temporarily holding member, than if the elements are directly embedded at respective predetermined positions (or in a predetermined pattern) in the light-transmitting layer.

In addition, since the temporarily holding member is used, an amount of projection of each of the photovoltaic elements can be changed. For example, the amount of projection of each photovoltaic element can be selected at the least possible amount that can allow the formation of the electrodes. The amount of projection of each of the photovoltaic elements may be selected at a predetermined amount, irrespective of the shape or size of the each element.

If the temporarily holding member is provided by a flat member, the member can be easily operated. However, it is not essentially needed that the temporarily holding member be provided by a flat member. Similarly, the temporarily holding surface may be a plane surface or a curved surface.

In the case where the light-transmitting layer is formed of a photosetting or photocurable material and is cured by light incident to the temporarily holding member, the temporarily holding member is preferably formed of a light-transmitting material. On the other hand, in the case where the light-transmitting layer is formed of a thermosetting material and is heated by heat applied to the temporarily holding member, the temporarily holding member is preferably formed of a material which is excellent to heat transfer. In many cases, the light-transmitting layer can be more easily cured or set by heat applied, or light incident, to the temporarily holding member.

When the photovoltaic elements are temporarily adhered to a plate-like holding member, an adhesive such as an adhesive sheet may be utilized. Preferably, the adhesive has a lower adhesiveness to the photovoltaic elements than its adhesiveness to the light-transmitting layer. In the latter case, when the plate-like member is removed from the light-transmitting layer after the layer is cured to hold the elements, the elements are prevented from coming off the layer.

(5) A method according to the fourth feature (4), wherein the step of moving comprises pressing, in a state in which the photovoltaic elements contact the light-transmitting layer, the temporarily-holding member and the light-transmitting layer against each other.

Since the temporarily-holding member and the light-transmitting layer pressed against each other, the photo photovoltaic elements can be surely embedded in the light-transmitting layer.

(6) A method according to any one of the third to fifth features (3) to (5), wherein the step of forming the light-transmitting layer comprises supplying the light-transmitting material to a container and thereby forming the light-transmitting layer.

In many cases, the light-transmitting layer is formed of a material in a liquid or half-solid state. Accordingly, the layer can be easily formed using the container.

Usually, the container is one that is used for just forming the light-transmitting layer and is not employed as part of the photovoltaic panel. Therefore, after the photovoltaic-element holding member is produced, or after the photovoltaic panel is produced, the container is removed. However, the container may be employed as part of the photovoltaic panel.

In the case where at least a portion of the container is formed of a light-transmitting material, that portion of the container need not be removed. That is, that portion of the container can be deemed as part of the light-transmitting layer, and a rigidity of the photovoltaic panel can be increased by that portion of the container.

In the case where the container is removed after the photovoltaic panel is produced, the container can be used to protect the light-transmitting layer during the production of the panel.

As will be described in DETAILED DESCRIPTION OF PREFERRED EMBODIMENTS, a portion of the container may be utilized as a stopper which defines a limit of movement of the temporarily holding member toward the container.

The container is not essentially needed to form the light-transmitting layer. For example, if the light-transmitting layer is formed of a material having a high viscosity, the container is not needed.

(7) A method according to the first feature (1), wherein the step of producing comprises arranging, according to a predetermined rule, a plurality of transparent spherical members, along a reference plane, and holding, with the arranged spherical members, the photovoltaic elements, such that the photovoltaic elements are positioned on the spherical members.

The transparent spherical members may be positioned at respective vertices of a triangle or a rectangle, as shown in FIG. 25 or FIG. 26, respectively, and respective positions of the photovoltaic elements are determined by the respective positions of the spherical members. In the example shown in FIG. 25, each photovoltaic element is supported by three spherical members; and, in the example shown in FIG. 26, each photovoltaic element is supported by four spherical members. The photovoltaic panel (i.e., closest packing) shown in FIG. 25 in which each photovoltaic element is supported by three spherical members enjoys a higher density of photovoltaic elements than that shown in FIG. 26.

Since the spherical members are arranged along a reference plane, i.e., in a single layer, respective positions of the photovoltaic elements are determined by the spherical members. That is, the photovoltaic elements can be positioned at respective desirable positions by selecting the size of the spherical members or the pattern in which the spherical members are positioned.

Preferably, the spherical members are formed of an optical ceramics or an optical resin. In addition, preferably, the spherical members have a higher strength than the photovoltaic elements, but this feature is not essentially needed.

For example, the photovoltaic-element holding member may be produced by first using the spherical members to hold the photovoltaic elements, casting a material before curing, a and then curing the material. Preferably, the material before curing has a lower viscosity than that of the light-transmitting material.

(8) A method according to any one of the fourth to seventh features (4) to (7), wherein the temporarily-holding member is formed of an elastic material, and wherein the step of temporarily holding comprises stretching the temporarily-holding member holding the photovoltaic elements, to change a space between each pair of adjacent photovoltaic elements of the plurality of photovoltaic elements.

The space between each pair of photovoltaic elements adjacent to each other can be increased by stretching the temporarily holding member. An amount of increasing of the space can be changed by changing an amount or proportion of stretching of the temporarily holding member.

For example, in the case where the temporarily holding member holds the photovoltaic elements such that there remains substantially no space between each pair of adjacent photovoltaic elements, a space is produced between each pair of adjacent photovoltaic elements, by stretching the temporarily holding member. In many cases, arranging the photovoltaic elements such that there remains substantially no space between each pair of adjacent photovoltaic elements, is easier than arranging the elements such that there remains a predetermined space between each pair of adjacent elements, and the photovoltaic elements arranged in the former manner enjoys a higher density than those arranged in the latter manner.

The temporarily holding member can be stretched in one direction only, or in each of two directions that intersect each other, preferably, two directions that are perpendicular to each other.

(9) A photovoltaic panel, comprising:

a plurality of photovoltaic elements each of which includes a P-type layer and an N-type layer;

a first electrode which is provided on one of opposite sides of a first plane intersecting the photovoltaic elements and which is electrically connected to the respective P-type layers of the photovoltaic elements;

a second electrode which is provided on the one of the opposite sides of the first plane and which is electrically connected to the respective N-type layers of the photovoltaic elements; and a light-transmitting layer which is formed of a light-transmitting material and which is provided on the other side of the first plane and which fills at least a space between the first plane and a second plane which is parallel to the first plane and is tangent to the photovoltaic elements.

In the photovoltaic panel according to this feature, both the first and second electrodes are formed on one of opposite sides of a first plane that intersects the photovoltaic elements, and the light-transmitting layer is formed on the other side of the plane. The light-transmitting layer is formed of a light-transmitting material which fills a space between the first plane and a second plane which is tangent to the photovoltaic elements. Thus, neither of the first and second electrodes are provided on the opposite side on which the light-transmitting layer is provided. Therefore, if light is incident to the light-transmitting layer, the photovoltaic panel can efficiently utilize the light incident thereto, without needing to decrease its light receiving area.

The material used to form the light-transmitting layer may be an optical ceramics or an optical resin. Preferably, the material is excellent with respect to light transmittance and is free of yellowing. More preferably, the material is excellent with respect to weather resistance, chemical resistance, and electrical insulation, and has a mechanical strength higher than a certain degree. More preferably, the material is excellent with respect to moldability or formability. The material may be toughened glass, acrylic resin, urethane resin, polycarbonate resin, or unsaturated-polyester resin.

Since the photovoltaic elements are held by the light-transmitting layer, the light-transmitting layer may be called as a photovoltaic-element holding layer.

(10) A photovoltaic panel according to the ninth feature (9), wherein the first plane divides each of the photovoltaic elements into a first portion whose volume is smaller than 50% of a volume of the each photovoltaic element, and a second portion whose volume is greater than 50% of the volume, and wherein the light-transmitting layer is provided on the other side of the first plane on which the respective second portions of the photovoltaic elements are located.

The more portions of the photovoltaic elements are embedded in the light-transmitting layer, the less likely the elements are to come off the layer. In view of this, it is desirable that the more portions of the photovoltaic elements be embedded. More specifically described, it is preferred that not less than 45%, 50%, 55%, 60%, 65%, or 70% of each photovoltaic element be embedded in the light-transmitting layer.

Electric power is generated at the P-N junction of each photovoltaic element. In the case where light is incident to respective portions of the respective P-N junctions of the photovoltaic elements that are embedded in the light-transmitting layer, and electric power is generated at those portions, it is preferred that more portions of the P-N junctions be embedded in the layer.

However, it cannot be said in all cases that the more portions of the P-N junctions are embedded, the more efficiently the electric power is generated. How effectively the photovoltaic elements are embedded depends on the direction in which light is incident to the photovoltaic panel, and/or the shape of the photovoltaic elements. When light is incident to the photovoltaic panel in a certain direction or directions, a portion of each photovoltaic element may be shaded by another portion of the same. In the case where each photovoltaic element has a generally spherical shape and somewhat more than 50% of the each element is embedded in the light-transmitting layer, at least half the each element can be utilized to generate electric power, irrespective of which side of the photovoltaic panel the light may be incident to.

In order to form the electrodes, it is required that some portion of each photovoltaic element remain not embedded in the light-transmitting layer. In view of this, it is preferred that not more than 60%, 65%, 70%, 75%, or 80% of each photovoltaic element be embedded in the layer.

(11) A photovoltaic panel according to the ninth or tenth feature (9) or (10), wherein the light-transmitting layer has a shape having two plane surfaces parallel to each other, and wherein one of the two plane surfaces is substantially parallel to the first plane and the other plane surface is substantially parallel to the second plane.

According to this feature, since the light-transmitting layer has a generally flat shape, the photovoltaic panel can be used with ease.

In addition, since the light receiving surface may be provided by a plane surface, the light is prevented from being scattered by the light receiving surface.

Moreover, an angle of incidence of the light to the photovoltaic panel can be easily changed.

(12) A method of producing a photovoltaic panel, comprising the steps of:

producing a light-transmitting, photovoltaic-element holding member which holds a plurality of photovoltaic elements along a reference surface, and forming at least one electrode which is electrically connected to the photovoltaic elements held by the photovoltaic-element holding member, wherein the step of producing comprises forming a light-transmitting layer of a light-transmitting material before curing, embedding at least respective portions of the photovoltaic elements in the light-transmitting layer, and curing the light-transmitting layer in a state in which the at least respective portions of the photovoltaic elements are embedded in the light-transmitting layer.

In the photovoltaic-panel producing method according to this feature, the light-transmitting layer is formed of a light-transmitting material before curing, and respective portions of the photovoltaic elements are embedded in the light-transmitting layer. Then, the light-transmitting layer is cured to produce a photovoltaic-element holding member. The present method can more easily produce the photovoltaic-element holding member than the conventional method in which, after a light-transmitting resin is applied to photovoltaic elements, the resin is cured.

The light-transmitting layer before curing has physical properties which allow respective portions of the photovoltaic elements to be embedded therein, that is, properties which maintain a state in which respective portions of the photovoltaic elements are embedded therein. It can also be said that the light-transmitting layer before curing has physical properties which assure that the layer is deformed while keeping close contact with the photovoltaic elements.

Because of the physical properties of the light-transmitting layer, the layer behaves like a fluid (i.e., is deformed) and respective portions of the photovoltaic elements can be embedded in the layer. In many cases, the light-transmitting layer is in a half-solid (or gel) state, but in some cases, it is in a liquid state. That the light-transmitting layer is in a state in which the photovoltaic elements can be embedded therein may be expressed in terms of a viscosity, or an elasticity, of the light-transmitting layer.

The light-transmitting layer needs to have physical properties which assure that respective portions of the photovoltaic elements are embedded therein, just at the time when the embedding step is carried out. However, when the light-transmitting layer is initially formed, the layer may have other physical properties. For example, the layer which has just been formed may have so low a viscosity that the layer cannot maintain a state in which respective portions of the photovoltaic elements are embedded therein.

When the light-transmitting layer is cured in a state in which respective portions of the photovoltaic elements are embedded therein, the layer can hold the photovoltaic elements. If at least respective portions of the photovoltaic elements are embedded in the layer, the layer can hold the elements.

(13) A method according to the twelfth feature (12), wherein the step of embedding comprises embedding more than 50% of a volume of each of the photovoltaic elements, in the light-transmitting layer.

The more portions of the photovoltaic elements are embedded in the light-transmitting layer, the less likely the elements are to come off the layer. In view of this, it is desirable that the more portions of the photovoltaic elements be embedded. More specifically described, it is preferred that not less than 45%, 50%, 55%, 60%, 65%, or 70% of each photovoltaic element be embedded in the light-transmitting layer. In order to form the electrodes, it is required that some portion of each photovoltaic element remain not embedded in the light-transmitting layer. In view of this, it is preferred that not more than 60%, 65%, 70%, 75%, or 80% of each photovoltaic element be embedded in the layer.

(14) A method according to the twelfth or thirteenth feature (12) or (13), wherein the step of embedding comprises embedding more than 50% of an area of junction of a P-type layer and an N-type layer of each of the photovoltaic elements, in the light-transmitting layer.

(15) A method according to any one of the twelfth to fourteenth features (12) to (14), wherein the step of embedding comprises embedding, in the light-transmitting layer, the photovoltaic elements such that an electric-power generating efficiency per unit area of the photovoltaic panel is higher than a predetermined value.

Electric power is generated at the P-N junction of each photovoltaic element. In the case where light is incident to respective portions of the respective P-N junctions of the photovoltaic elements that are embedded in the light-transmitting layer, and electric power is generated at those portions, it is preferred that more portions of the P-N junctions be embedded in the layer.

However, it cannot be said in all cases that the more portions of the P-N junctions are embedded, the more efficiently the electric power is generated. How effectively the photovoltaic elements are embedded depends on the direction in which light is incident to the photovoltaic panel, and/or the shape of the photovoltaic elements. When light is incident to the photovoltaic panel in a certain direction or directions, a portion of each photovoltaic element may be shaded by another portion of the same. In the case where electric power is generated by light incident through the light-transmitting layer and each photovoltaic element has a generally spherical shape, it is preferred that somewhat more than 50% of the each element be embedded in the light-transmitting layer.

(16) A method according to any one of the twelfth to fifteenth features (12) to (15), wherein the step of curing comprises at least one of heating the light-transmitting layer, cooling the light-transmitting layer, and exposing the light-transmitting layer to light.

The material used to form the light-transmitting layer is cured after the photovoltaic elements are embedded therein. Some materials are heated for curing; some materials are cooled for curing; and other materials are exposed to light, such as ultraviolet rays or light containing ultraviolet rays, for curing.

The materials that are cured by heating are, e.g., thermosetting resins; the materials that are cured by cooling are, e.g., glass; and the materials that are cured by light are, e.g., photocurable resins (or photosensitive resins). In each case, it is preferred that the material be excellent with respect to not only light transmittance but also heat resistance and weather resistance.

The thermosetting resins are, e.g., UV-curable acrylic resins or UV-curable urethane resins.

(17) A method according to any one of the twelfth to sixteenth features (12) to (16), wherein the step of embedding comprises temporarily holding, with a temporarily holding surface of a temporarily holding member, the photovoltaic elements, moving the temporarily-holding member holding the photovoltaic elements, toward the light-transmitting layer, till the respective portions of the photovoltaic elements are embedded in the light-transmitting layer.

In the producing method according to this feature, the temporarily holding surface of the temporarily holding member holds a number of photovoltaic elements, and the temporarily-holding member holding the photovoltaic elements is moved toward the light-transmitting layer, so that respective portions of the photovoltaic elements are embedded in the light-transmitting layer. That is, the photovoltaic elements are embedded in the light-transmitting layer, not directly, but indirectly using the temporarily-holding member. In some cases, the photovoltaic elements can be more easily embedded in the light-transmitting layer before curing, if the elements are temporarily held by the temporarily holding surface of the temporarily holding member, than if the elements are directly embedded at respective predetermined positions (or in a predetermined pattern) in the light-transmitting layer.

If the temporarily holding member is provided by a flat member, the member can be easily operated. However, it is not essentially required that the temporarily holding member be provided by a flat member. Similarly, the temporarily holding surface may be either a plane surface or a curved surface.

In the case where the light-transmitting layer is formed of a photocurable material and is cured by light incident to the temporarily holding member, the temporarily holding member is preferably formed of a light-transmitting material. On the other hand, in the case where the light-transmitting layer is formed of a thermosetting material and is heated by heat applied to the temporarily holding member, the temporarily holding member is preferably formed of a material which is excellent to heat transfer. In many cases, the light-transmitting layer can be more easily cured or set by heat applied, or light incident, to the temporarily holding member.

(18) A method according to the sixteenth feature (16), wherein the step of temporarily holding comprises temporarily fixing the photovoltaic elements to an adhesive layer which is formed on the temporarily holding surface of the temporarily holding member.

The adhesive layer needs to hold just temporarily the photovoltaic elements, and need not hold the same for a long time. The adhesive layer is, e.g., a transparent adhesive sheet.

(19) A method according to the seventeenth or eighteenth feature (17) or (18), wherein the step of temporarily holding comprises temporarily holding, with an arranging member, the photovoltaic elements on the temporarily holding surface of the temporarily holding member.

Since the arranging member is used, the photovoltaic elements can be positioned at respective desired positions on the temporarily holding surface of the temporarily holding member. In addition, the arranging member may be used to define a distance between each pair of photovoltaic elements adjacent to each other.

The arranging member may be one which has a number of openings.

(20) A method according to the seventeenth or eighteenth feature (17) or (18), wherein the temporarily-holding member is formed of an elastic material, and wherein the step of temporarily holding comprises stretching the temporarily-holding member holding the photovoltaic elements, to change a space between each pair of adjacent photovoltaic elements of the plurality of photovoltaic elements.

The space between each pair of photovoltaic elements adjacent to each other can be increased by stretching the temporarily holding member. An amount of increasing of the space can be changed by changing an amount or proportion of stretching of the temporarily holding member.

For example, in the case where the temporarily holding member holds the photovoltaic elements such that there remains substantially no space between each pair of adjacent photovoltaic elements, a space is produced between each pair of adjacent photovoltaic elements, by stretching the temporarily holding member. In many cases, arranging the photovoltaic elements such that there remains substantially no space between each pair of adjacent photovoltaic elements, is easier than arranging the elements such that there remains a predetermined space between each pair of adjacent elements, and the photovoltaic elements arranged in the former manner enjoys a higher density than those arranged in the latter manner.

The temporarily holding member may be stretched in one direction only, or in each of two directions that intersect each other, preferably, two directions that are perpendicular to each other.

(21) A method according to the twentieth feature (20), wherein the step of moving the temporarily-holding member comprises moving the temporarily-holding member toward the light-transmitting layer, while preventing contraction of the temporarily-holding member stretched.

In the case where the temporarily-holding member is provided by an elastic member which is not plastically deformed when being stretched by an external force, i.e., which is used within a range of elastic deformation, the temporarily-holding member contracts because of its elastic force, if the external force is removed. Hence, the temporarily-holding member is kept stretched to prevent its contraction.

(22) A method according to any one of the seventeenth to twenty-first features (17) to (21), wherein the step of temporarily holding comprises arranging, in a container, the photovoltaic elements into a single layer such that the photovoltaic elements contact with each other, and pressing the temporarily holding member against the photovoltaic elements arranged in the single layer in the container.

For example, if the photovoltaic elements are supplied to the container which is being vibrated, the spaces among the photovoltaic elements can be reduced and can be easily packed such that there is substantially no space between each pair of adjacent photovoltaic elements. In the photovoltaic-panel producing method according to this feature, the density of the photovoltaic elements held by the temporarily holding member can be easily increased.

(23) A method according to any one of the seventeenth to twenty-second features (17) to (22), wherein the step of moving comprises pressing, in a state in which the photovoltaic elements contact the light-transmitting layer, the temporarily-holding member and the light-transmitting layer against each other.

When the temporarily-holding member and the light-transmitting layer are pressed against each other, the photovoltaic elements can be easily forced into the light-transmitting layer. To this end, it is preferred to employ a stopper which defines a limit of movement of the temporarily-holding member and the light-transmitting layer toward each other. In the latter case, it is possible to embed appropriately the photovoltaic elements in the light-transmitting layer.

Meanwhile, it is possible to carry out concurrently the curing step and the pressing step. In the case where the light-transmitting layer is cured slowly, the photovoltaic elements can be embedded in the light-transmitting layer being cured.

(24) A method according to any one of the seventeenth to twenty-third features (17) to (23), wherein the step of producing further comprises removing, after the step of curing, the temporarily holding member from the light-transmitting layer cured.

After the light-transmitting layer is cured, the temporarily-holding member is removed from the layer to provide the photovoltaic-element holding member.

(25) A method according to any one of the twelfth to twenty-fourth features (12) to (24), wherein the step of forming the light-transmitting layer comprises supplying the light-transmitting material to a container and thereby forming the light-transmitting layer.

In many cases, the light-transmitting layer is formed of a material in a liquid or half-solid state. Accordingly, the light-transmitting layer can be easily formed using the container.

Usually, the container is used for just forming the light-transmitting layer and is not used as part of the photovoltaic panel. Therefore, after the photovoltaic-element holding member is produced, or after the photovoltaic panel is produced, the container is removed. However, the container may be employed as part of the photovoltaic panel.

In the case where at least a portion of the container is formed of a light-transmitting material, that portion of the container need not be removed. That is, that portion of the container can be deemed as part of the light-transmitting layer, and a rigidity of the photovoltaic panel can be increased by that portion of the container.

In the case where the container is removed after the photovoltaic panel is produced, the container can be used to protect the light-transmitting layer during the production of the photovoltaic panel. As will be described in DETAILED DESCRIPTION OF PREFERRED EMBODIMENTS, a portion of the container may be utilized as a stopper which defines a limit of movement of the temporarily holding member toward the container.

The container is not essentially needed to form the light-transmitting layer. For example, if the light-transmitting layer is formed of a material having a high viscosity, the container is not needed.

(26) A method according to any one of the twelfth to twenty-fifth features (12) to (25), wherein the step of forming the at least one electrode comprises forming two electrodes on one of opposite sides of the photovoltaic-element holding member.

(27) A method according to any one of the twelfth to twenty-fifth features (12) to (25), wherein the step of forming the at least one electrode comprises forming two electrodes on opposite sides of the photovoltaic-element holding member, respectively.

An electrode connected to respective P-type layers of the photovoltaic elements, and an electrode connected to respective N-type layers of the elements may be both provided on one of opposite sides of the photovoltaic-element holding member, or may be respectively provided on the opposite sides of the holding member. In the latter case, one electrode which is provided on one side of the holding member to which light is incident is formed to cover only a portion of the light receiving surface of the holding member so that the light is efficiently utilized by the photovoltaic elements, or is formed of a transparent material.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF PREFERRED EMBODIMENTS

Hereinafter, there will be described an embodiment of the present invention in detail by reference to the drawings.

Figure 1:
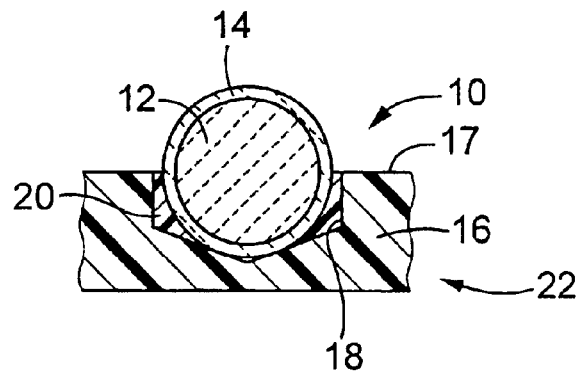
FIG. 1 is a view showing a step of a photovoltaic-panel producing method to which the present invention is applied and by which a photovoltaic panel to which the present invention is also applied is produced.

In FIG. 1, reference numeral 10 designates a silicon ball as a photovoltaic element. The silicon ball 10 includes a core portion or layer 12 as a P-type silicon, and a shell portion or layer 14 as an N-type silicon. Reference numeral 16 denotes a holding plate as a light-transmitting layer that holds a number of silicon balls or photovoltaic elements 10.

A number of recesses 18 each as a photovoltaic-element holding portion are formed in a photovoltaic-element holding surface 17 of the holding plate 16, such that the recesses 18 are distant from one another at predetermined regular intervals (this is a photovoltaic-element-holding-portion forming step), and a photovoltaic element 10 is placed in each of the recesses 18. Each of the recesses 18 is provided with adhesive, and a photovoltaic element 10 is fixed to the each recess 18 via an adhesive layer 20 (this is a photovoltaic-element-holding-member producing step or a photovoltaic-element fixing step). The photovoltaic elements 10 and the holding plate 16 cooperate with each other to provide a photovoltaic-element holding plate 22 as a photovoltaic-element holding member.

It is preferred that the holding plate 16 be formed of a material which is excellent with respect to light transmittance, chemical resistance, weather resistance, electrical insulation, and adhesiveness to silicon, and has a certain degree of mechanical strength. In addition, preferably, the holding plate 16 is formed of a material which is free of yellowing. For example, the holding plate 16 is formed of an optical ceramics, such as toughened glass, or an optical resin, such as acrylic resin, urethane resin, or polycarbonate resin.

The intervals between the recesses 18 of the holding plate 16 are so optimized as to locate appropriately the photovoltaic elements 10. If the intervals are too small, a power generating efficiency of each photovoltaic element 10 lowers; and if the intervals are too great, i.e., if the density of the photovoltaic elements 10 is too low, a power which is generated by each photovoltaic panel lowers. In view of these facts, the intervals between the photovoltaic elements 10, i.e., respective positions of the recesses 18 are determined based on, e.g., a size of the elements 10.

The photovoltaic elements 10 are located at the respective positions on the holding plate 16 where the recesses 18 are formed, and accordingly the holding plate 16 functions as an arranging plate. In addition, as will be described later, the photovoltaic elements 10 receive light via the holding plate 16. Thus, the holding plate 16 also functions as a light receiving plate or a light-incident plate.

The adhesive (i.e., resin) used to form the adhesive layer 20 may be one which has the same properties as those of the holding plate 16 (the adhesive may be the same material as that of the holding plate 16). However, the adhesive does not need a high degree of mechanical strength. Thus, it is preferred that the adhesive be excellent with respect to at least light transmittance, adhesiveness to the photovoltaic elements 10 (silicon), and adhesiveness to the holding plate 16. In addition, preferably, the adhesive is excellent with respect to applicability to the holding plate 16, i.e., semi-solid (gel) or liquid in use. Moreover, the adhesive is desired to contain a thermosetting resin or a photocurable resin. After the photovoltaic elements 10 are placed in the recesses 18, the adhesive is heated, or exposed to light, to fix the elements 10 to the holding plate 16. For example, the adhesive may be one which contains an acrylic resin, a urethane resin, a polycarbonate resin, or an unsaturated-polyester resin.

At any rate, it is not needed to position, with high accuracy, the photovoltaic elements 10 relative to the holding plate 16 or produce the elements 10 themselves with highly accurate dimensions. That is, it is not needed to produce, with high accuracy, the photovoltaic-element holding plate 22, and as such the cost of production of the plate 22 can be lowered.

Figure 2:
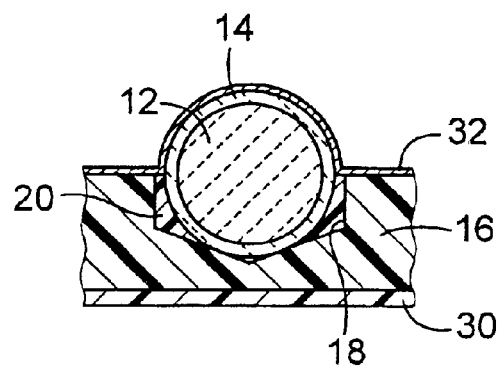
FIG. 2 is a view showing another step of the photovoltaic-panel producing method.

As shown in FIG. 2, a protective layer 30 is formed on an opposite surface of the holding plate 16 that is opposite to the holding surface 17 (this is a protective-layer forming step), and subsequently a first electrode portion 32 is so formed as to cover the holding surface 17 of the photovoltaic-element holding plate 22 and respective projecting portions of the photovoltaic elements 10 that project from the holding plate 16 (this is an electrode-plate forming step).

The protective layer 30 is provided for preventing a plating liquid from adhering to the holding plate 16, or preventing the holding plate 16 from being mechanically damaged. That is, the protective layer 30 is provided for preventing lowering of the light transmittance of the holding plate 16. A commercially available masking tape (for example, a solder-adhesion preventing tape which can be called as solder masking tape) may be used as the protective layer 30. The masking tape can be easily peeled while leaving little glues.

In the present embodiment, the first electrode portion 32 is formed by a chemical plating (electroless plating) using a plating liquid containing a nickel alloy. Thus, a nickel coating (electrically conductive layer) is formed.

However, the conductive layer may be formed of a different material than the nickel alloy; for example, aluminum, cobalt, palladium, copper, silver, gold, or any alloy containing al least one of those metals. In addition, the conductive layer may be formed by a different method than the chemical plating; for example, CVD (chemical vapor deposition), PVD (physical vapor deposition), or direct application of a conductive material (e.g., conductive silver paste adhesive). The first electrode portion 32 may be provided by not a single conductive layer but a plurality of conductive layers (metallic layers) that are stacked on each other. In the latter case, the electrical conductivity can be stabilized. In the latter case, the plurality of conductive layers may be formed by a same sort of metal, or different sorts of metals.

Figure 3:
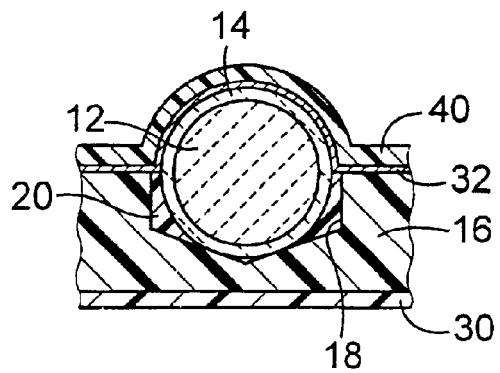
FIG. 3 is a view showing another step of the photovoltaic-panel producing method.

As shown in FIG. 3, an electrically insulating layer 40 is formed on portions of the first electrode portion 32 that correspond to the holding surface 17 of the holding plate 16 (this is an insulating-layer forming step). The insulating layer 40 needs to be formed of an electrically insulting material, but need not be formed of a light-transmitting material. For example, the insulting layer 40 may be formed of an acrylic resin, a urethane resin, a polycarbonate resin, an unsaturated-polyester resin, or an epoxy resin. The insulating layer 40 may be formed by first applying, using a brush, the resin in gel or liquid and then irradiating or heating the resin. In this manner, the insulating layer 40 may include portions that are formed on portions of the first electrode portion 32 that correspond to the photovoltaic elements 10. However, those portions of the insulating layer 40 are removed together with those portions of the first electrode portion 32, in the subsequent removing step.

Alternatively, the insulating layer 40 may be formed in such a manner that a film having openings at respective positions corresponding to the recesses 18 of the holding plate 16 is placed on the first electrode portion 32 of the photovoltaic-element holding plate 22, such that the openings are aligned with the photovoltaic elements 10, and subsequently the film is heated, or heated and pressed, to form the layer 40 (this is a heat- or pressure-utilizing insulating-layer forming step). In the case where the film is a flexible or transparent one, the insulating layer 40 can be easily formed of the film.

Figure 4:
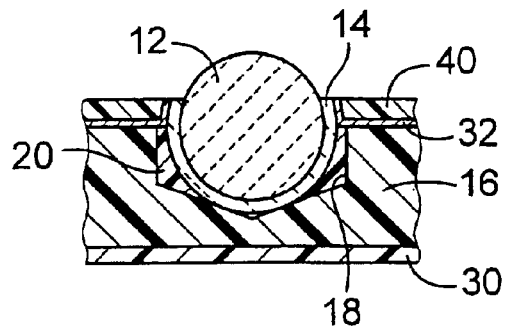
FIG. 4 is a view showing another step of the photovoltaic-panel producing method.

As shown in FIG. 4, the above-indicated portions of the first electrode portion 32 and the above-indicated portions of the insulating layer 40 are mechanically removed by sand blasting (this is an insulating-layer removing step and a first-electrode-portion removing step). Then, a portion of the N-type shell layer 14 of each photovoltaic element 10 is removed by etching to expose the P-type core layer 12 (this is an N-type-layer removing step). A mixture of hydrofluoric acid (HF) and nitric acid ($HNO_3$) may be used as an etching liquid.

Figure 5:
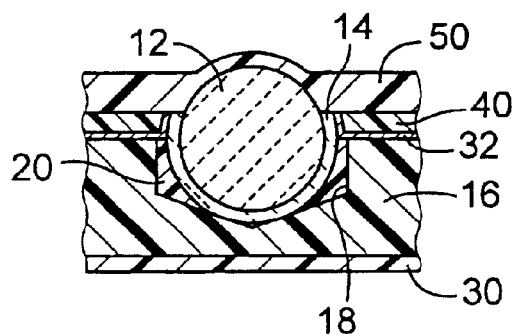
FIG. 5 is a view showing another step of the photovoltaic-panel producing method.

As shown in FIG. 5, another electrically insulating layer 50 is formed, in the same manner as described above, on the side of the holding surface 17 of the photovoltaic-element holding plate 22 (this is an insulating-layer forming step). The insulating layer 50 covers the respective N-type layers 14 of the photovoltaic elements 10 and the first electrode portion 32. The insulating layer 50 may be formed of the same material as that of the insulating layer 40. The insulating layer 50 need not be formed of a light-transmitting material.

Figure 6:
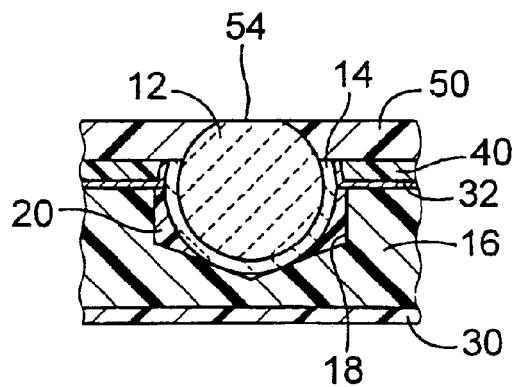
FIG. 6 is a view showing another step of the photovoltaic-panel producing method.

As shown in FIG. 6, respective portions of the insulating layer 50 and the P-type layer 12 of each photovoltaic element 10 are removed, by a mechanical method, e.g., sand blasting, to form a flat portion 54 (this is a flat-portion forming step). Thus, a photovoltaic panel as a whole can be formed to have a flat shape, and accordingly can be used with each. In addition, a second electrode portion 60 can be formed easily.

In the case where the insulating layer 50 is formed except on the respective P-type layers 12 of the photovoltaic elements 10, it is not needed to remove any portions of the insulating layer 50. In addition, it is not essential to form the respective flat portions 54 of the P-type layers 12.

Figure 7:
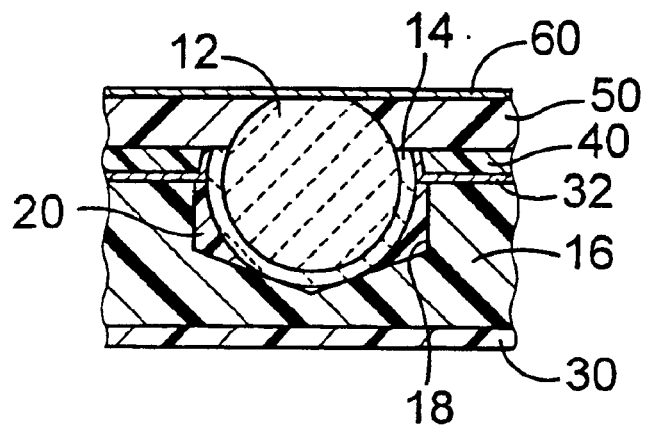
FIG. 7 is a view showing another step of the photovoltaic-panel producing method.

As shown in FIG. 7, the second electrode portion 60 is formed (this is a second-electrode-portion forming step). In the present embodiment, the second electrode portion 60 is so formed as to cover all the respective flat portions 54 of the photovoltaic elements 10 and the entirety of the insulating layer 50. The second electrode portion 60 may be formed of the same material as that of the first electrode portion 30, in the same manner as that in which the first electrode 30 is formed.

Figure 8:
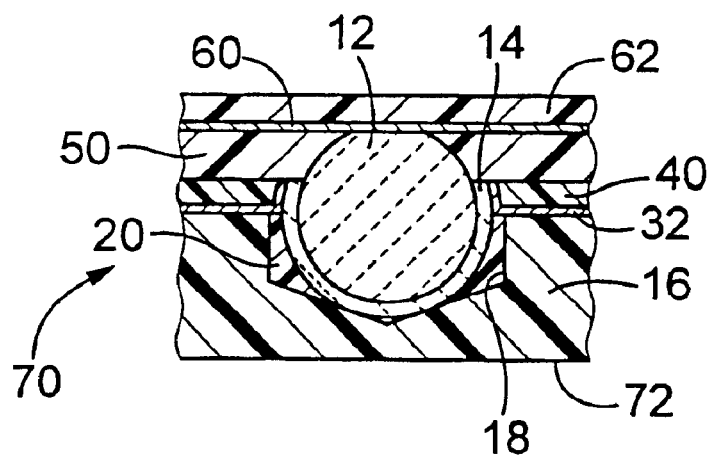
FIG. 8 is a cross-sectional view of the photovoltaic panel produced by the photovoltaic-panel producing method.

As shown in FIG. 8, a protective layer 62 is formed to protect the second electrode portion 60 (this is a protective-layer forming step). The protective layer 62 may be formed of ceramics, metal, or resin (e.g., toughened plastics).

Then, the protective layer 30 is removed to provide a photovoltaic panel 70 having a light-receiving surface 72 thus exposed.

When light is incident to the light-receiving surface 72 of the photovoltaic panel 70, electric power is generated between the P-type layer 12 and the N-type layer 14 of each of the photovoltaic elements 10, so that an electric current flows between the first electrode portions 32 and the second electrode portion 60 via an external resistor (not shown).

Thus, both the first and second electrode portions 32, 60 are formed on one of opposite sides of the photovoltaic-element holding plate 22, and neither of them are formed on the other side. Therefore, the area of the light-receiving surface 72 is not decreased by the provision of those electrode portions 32, 60, and the light incident to the surface 72 can be most efficiently utilized.

The photovoltaic-element holding plate 22 may be formed in a different manner than the above-described manner.

Figure 9:
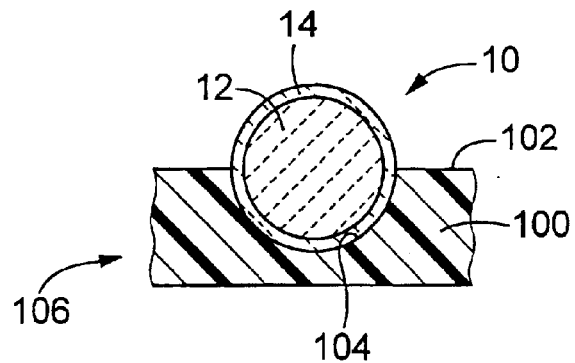
FIG. 9 is a view showing a step of another photovoltaic-panel producing method as another embodiment of the present invention and by which a photovoltaic panel as another embodiment of the present invention is produced.
Figure 10:
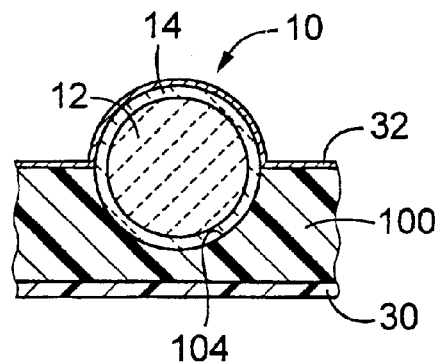
FIG. 10 is a view showing another step of the photovoltaic-panel producing method of FIG. 9.
Figure 11:
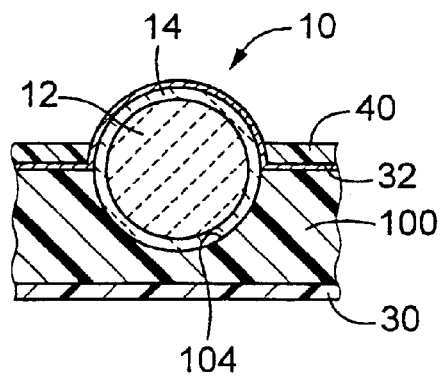
FIG. 11 is a view showing another step of the photovoltaic-panel producing method of FIG. 9.
Figure 12:
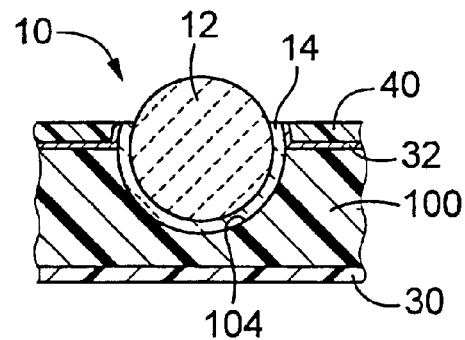
FIG. 12 is a view showing another step of the photovoltaic-panel producing method of FIG. 9.
Figure 13:
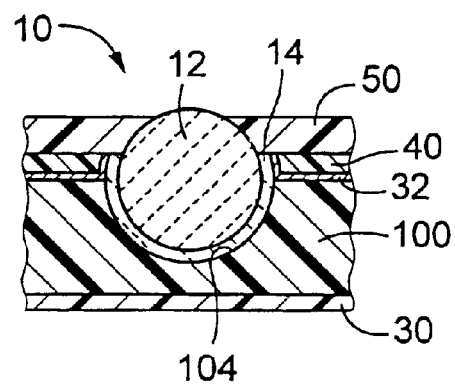
FIG. 13 is a view showing another step of the photovoltaic-panel producing method of FIG. 9.
Figure 14:
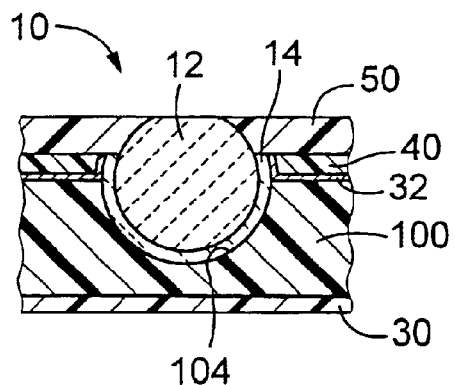
FIG. 14 is a view showing another step of the photovoltaic-panel producing method of FIG. 9.
Figure 15:
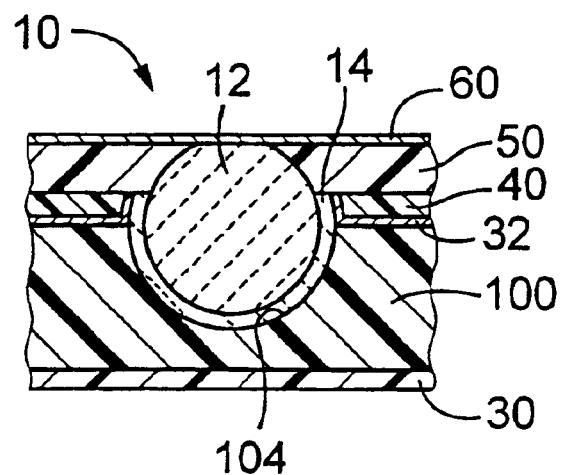
FIG. 15 is a view showing another step of the photovoltaic-panel producing method of FIG. 9.
Figure 16:
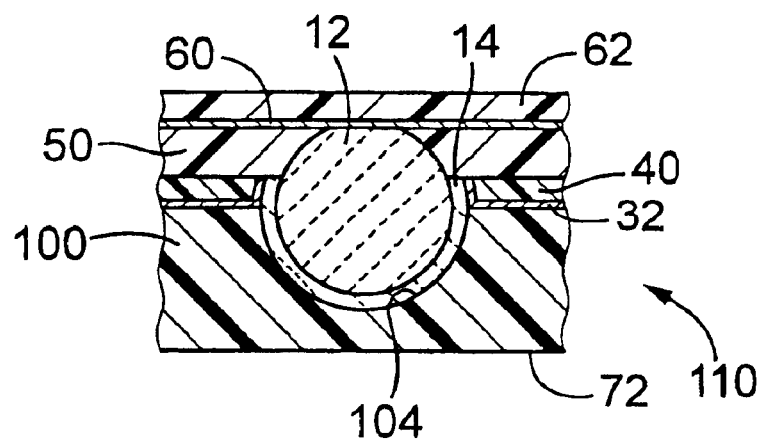
FIG. 16 is a cross-sectional view of the photovoltaic panel produced by the photovoltaic-panel producing method of FIG. 9.

For example, FIG. 9 shows another embodiment in which a holding plate 100 has, in a holding surface 102 thereof, a number of photovoltaic-element holding portions 104 each of which has a shape corresponding to the shape of each photovoltaic element 10. For example, a pressure force or a pressure is applied to the photovoltaic elements 10 to force the elements 10 into the photovoltaic-element holding portions 104, and thereby form a photovoltaic-element holding member 106. FIGS. 9, 10, 11, 12, 13, 14, and 15 show respective steps of a method in which a photovoltaic panel 110 is produced using the photovoltaic-element holding member 106, and FIG. 16 shows the photovoltaic panel 110 thus produced.

It is preferred that each photovoltaic-element holding portion 104 be somewhat smaller than a size of each photovoltaic element 10. In this case, each element 10 can be surely fitted in, and fixed to, the holding plate 100. However, the photovoltaic elements 10 may be fixed to the holding plate 100 with an adhesive, like in the preceding embodiment.

Figure 17:
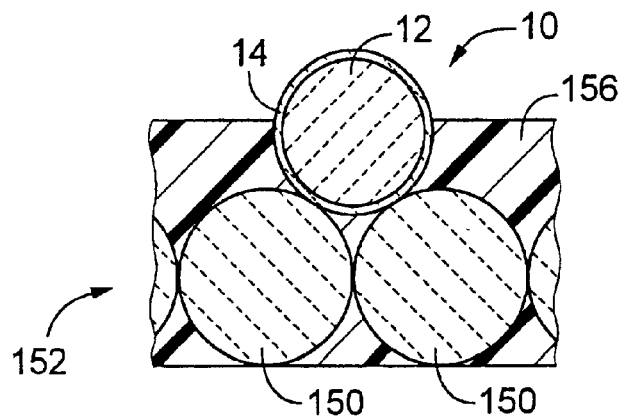
FIG. 17 is a view showing a step of another photovoltaic-panel producing method as another embodiment of the present invention and by which a photovoltaic panel as another embodiment of the present invention is produced.
Figure 18:
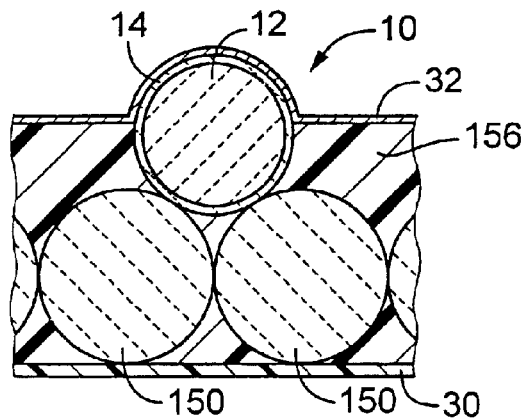
FIG. 18 is a view showing another step of the photovoltaic-panel producing method of FIG. 17.
Figure 19:
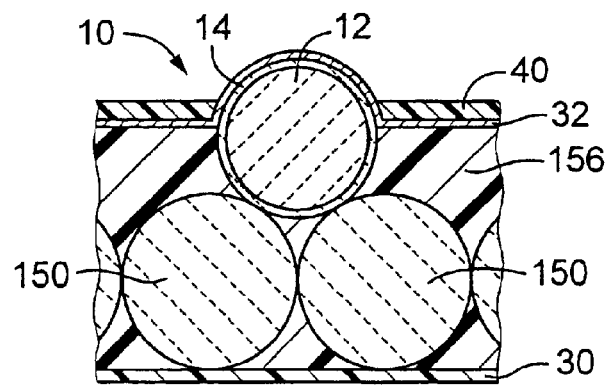
FIG. 19 is a view showing another step of the photovoltaic-panel producing method of FIG. 17.
Figure 20:
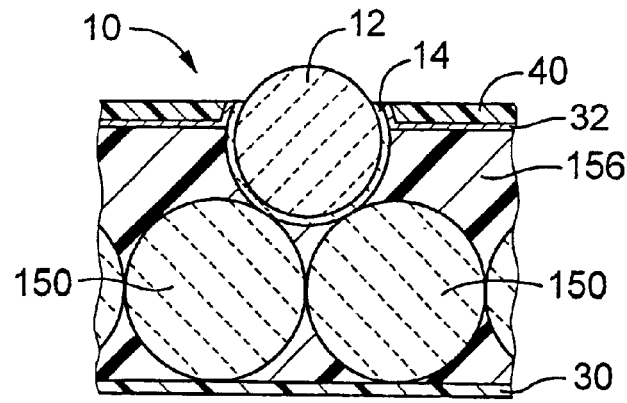
FIG. 20 is a view showing another step of the photovoltaic-panel producing method of FIG. 17.
Figure 21:
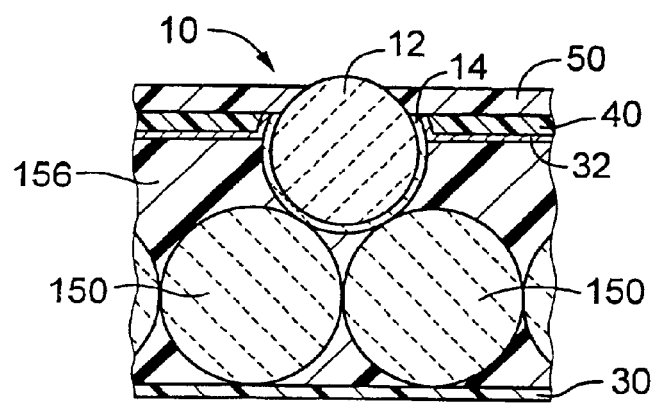
FIG. 21 is a view showing another step of the photovoltaic-panel producing method of FIG. 17.
Figure 22:
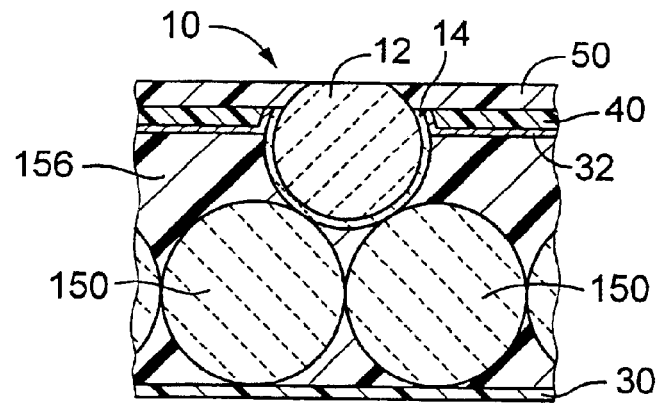
FIG. 22 is a view showing another step of the photovoltaic-panel producing method of FIG. 17.
Figure 23:
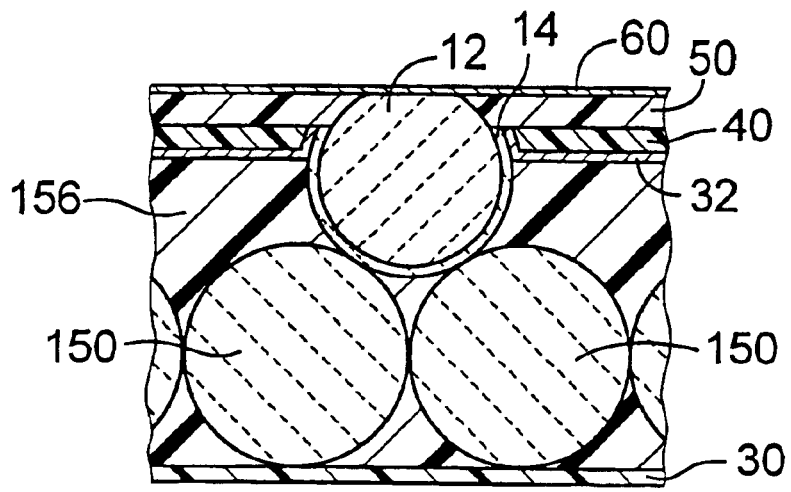
FIG. 23 is a view showing another step of the photovoltaic-panel producing method of FIG. 17.

FIG. 17 shows another embodiment in which a photovoltaic-element holding member is formed using generally spherical holding members 150. More specifically described, the spherical holding members 150, each having a uniform size somewhat larger than each photovoltaic element 10, are arranged into a single, closest-packed layer (this is a spherical-holding-portion arranging step). Then, photovoltaic elements 10 are supplied onto the layer of spherical holding members 150, and additionally a gel or half-solid material is supplied (this is a photovoltaic-element supplying step). The gel or half-solid material is cured and a photovoltaic-element holding member 152 is formed. In the present embodiment, the gel or half-solid material is cured into a light-transmitting adhesive layer 156.

Each of the spherical holding members 150 is formed of a light-transmitting material, which may be plastics, ceramics (e.g., glass), or metal. It is preferred that the adhesive layer 156 be formed of a light-transmitting material which can be well adhered to both the spherical holding members 150 and the photovoltaic elements 10. In the case where the spherical holding members 150 and the adhesive layer 156 are formed of a same material, a difference between refraction factors of the members 150 and the layer 156 can be minimized to advantage.

Figure 24:
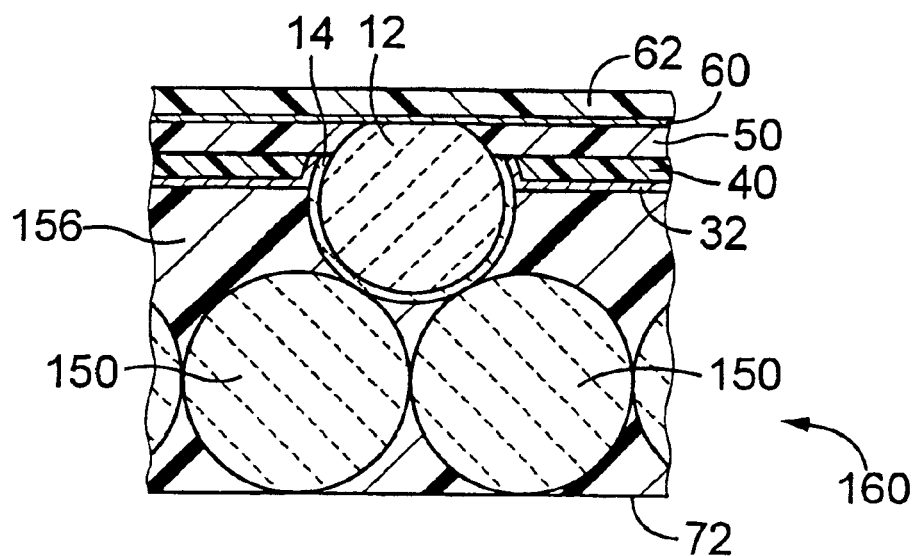
FIG. 24 is a cross-sectional view of the photovoltaic panel produced by the photovoltaic-panel producing method of FIG. 17.
Figure 25:
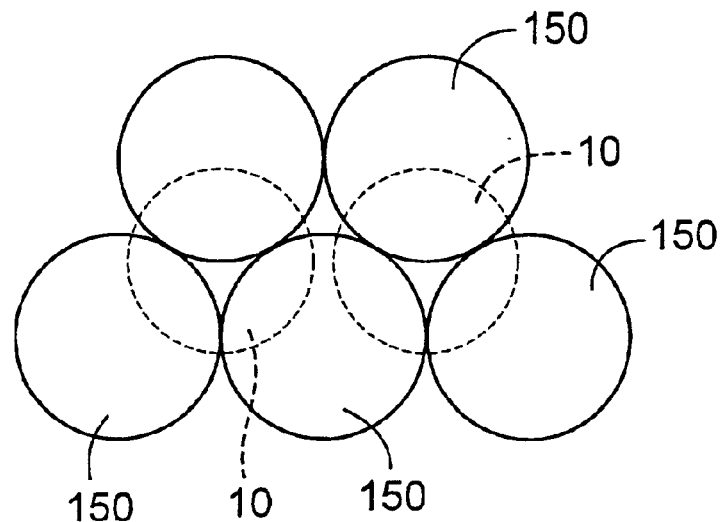
FIG. 25 is a view showing a state in which photovoltaic elements are arranged in the photovoltaic panel produced by the photovoltaic-panel producing method of FIG. 17.

In the present embodiment, as illustrated in FIG. 25, the spherical holding members 150 are arranged such that every three adjacent members 150 define a triangle (in a closest-packed state), and each photovoltaic element 10 is positioned at the center of the triangle. The positioning of each photovoltaic element 10 depends on the state in which the spherical holding members 150 are packed. FIGS. 17, 18, 19, 20, 21, 22, and 23 show respective steps of a method in which a photovoltaic panel 160 is produced using the photovoltaic-element-holding member 152, and FIG. 24 shows the photovoltaic panel 160 thus produced. Thus, in the present embodiment, the photovoltaic elements 10 can be arranged with ease, without needing to position, with accuracy, the individual elements 10 at respective predetermined positions.

Figure 26:
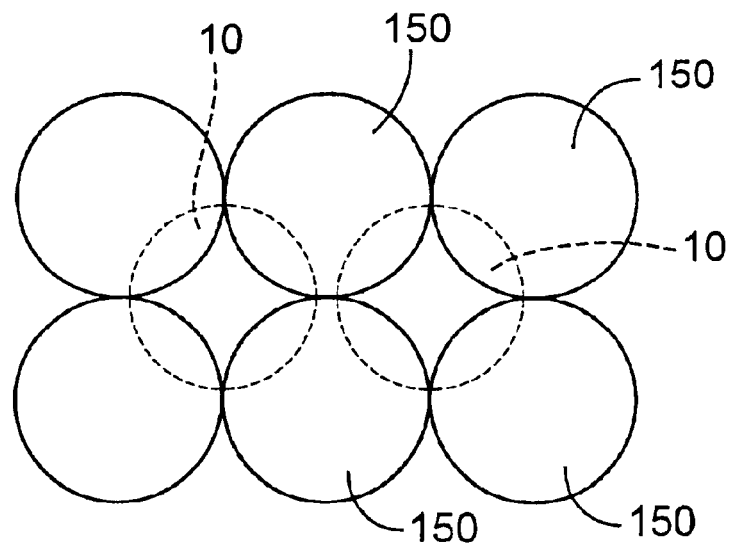
FIG. 26 is a view showing a state in which photovoltaic elements are arranged in another photovoltaic panel produced by another photovoltaic-panel producing method as another embodiment of the present invention.

The spherical holding members 150 may be arranged in not the state shown in FIG. 25 but a state shown in FIG. 26. More specifically described, the spherical holding members 150 are arranged such that every four adjacent members 150 define a square, and each photovoltaic element 10 is positioned at the center of the square. When the photovoltaic elements 10 positioned at the respective centers of the squares are compared with the photovoltaic elements 10 positioned at the respective centers of the triangles, the latter elements 10 enjoys a higher density and generates more electric power per area of photovoltaic panel, than the former elements 10.

Figure 27:
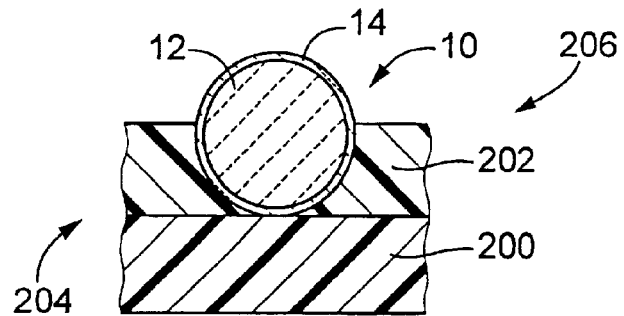
FIG. 27 is a view showing a step of another photovoltaic-panel producing method as another embodiment of the present invention and by which a photovoltaic panel as another embodiment of the present invention is produced.
Figure 28:
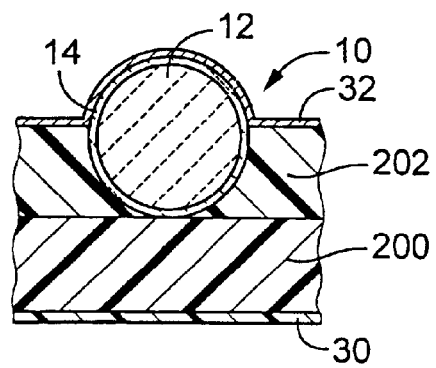
FIG. 28 is a view showing another step of the photovoltaic-panel producing method of FIG. 27.
Figure 29:
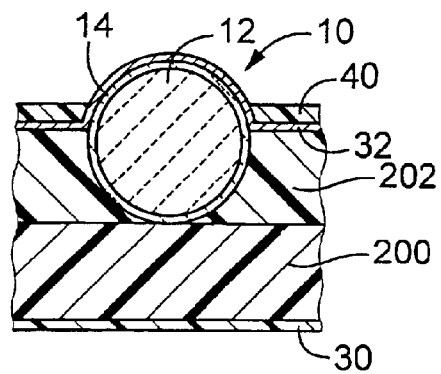
FIG. 29 is a view showing another step of the photovoltaic-panel producing method of FIG. 27.
Figure 30:
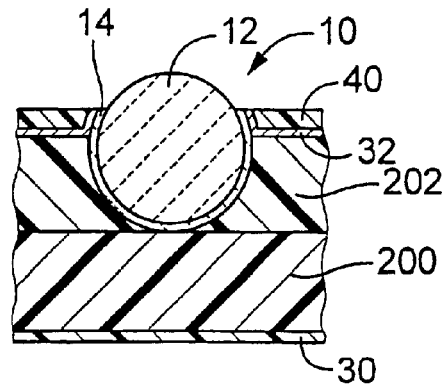
FIG. 30 is a view showing another step of the photovoltaic-panel producing method of FIG. 27.
Figure 31:
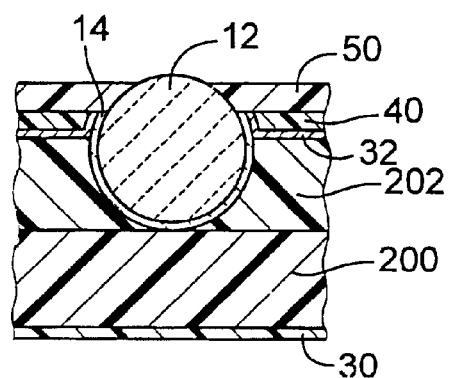
FIG. 31 is a view showing another step of the photovoltaic-panel producing method of FIG. 27.
Figure 32:
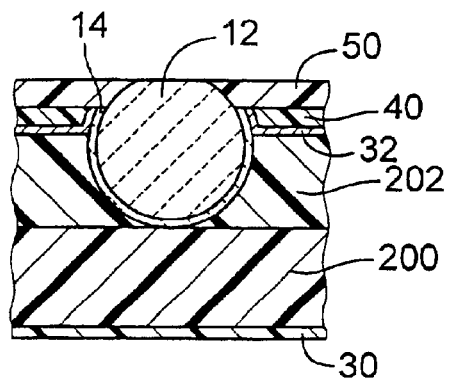
FIG. 32 is a view showing another step of the photovoltaic-panel producing method of FIG. 27.
Figure 33:
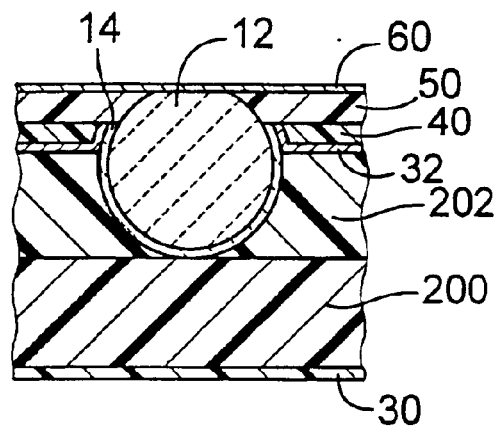
FIG. 33 is a view showing another step of the photovoltaic-panel producing method of FIG. 27.

FIG. 27 shows another embodiment in which two layers are provided to hold photovoltaic elements 10. On a surface of a rigid, light-transmitting flat member 200, a resin layer 202 is formed of a light-transmitting material that is in gel in use before curing (this is a holding-layer forming step). Then, the photovoltaic elements 10 are partly embedded (this is an embedding step), and subsequently the resin layer 202 is cured (this is a curing step) to hold firmly the elements 10. In the present embodiment, the flat member 200 and the resin layer 202 cooperate with each other to provide a holding layer 204 as a light-transmitting layer, and the holding layer 204 and the photovoltaic elements 10 cooperate with each other to provide a photovoltaic-element holding member 206.

In the present embodiment, the photovoltaic elements 10 are embedded in the resin layer 202 before curing. Thus, it is not needed to form, in the holding layer 204, any photovoltaic-element holding portions such as recesses. In addition, since the holding layer 204 includes the rigid flat member 200, the resin layer 202 may be formed of a material which does not have a mechanical rigidity. Thus, the degree of freedom of choice of material is increased. Moreover, the photovoltaic elements 10 can be accurately embedded in the resin layer 202, without needing to adjust the amount of embedding, because the embedding of the elements 10 is stopped by the rigid flat member 200.

Figure 34:
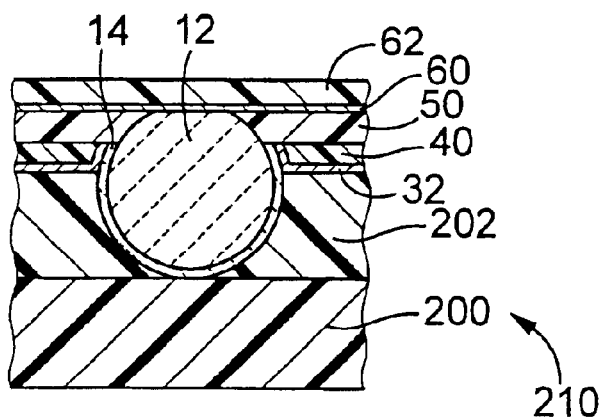
FIG. 34 is a cross-sectional view of the photovoltaic panel produced by the photovoltaic-panel producing method of FIG. 27.

FIGS. 27, 28, 29, 30, 31, 32, and 33 show respective steps of a method in which a photovoltaic panel 210 is produced using the photovoltaic-element holding member 206, and FIG. 34 shows the photovoltaic panel 210 thus produced.

The flat member 200 may be omitted, and the holding layer as the light-transmitting layer may be provided by the resin layer 202 only.

In the present embodiment, the photovoltaic elements 10 are directly embedded in the resin layer 202 in gel, to produce the photovoltaic-element holding member 206. However, the photovoltaic elements 10 may be embedded using a temporarily holding member.

For example, after photovoltaic elements 10 are temporarily held at respective predetermined positions on a holding surface of the temporarily holding member, the elements 10 are embedded in a resin layer. FIGS. 35, 36, 37, 38, 39, 40, and 41 show respective steps of a method in which a photovoltaic-element holding member is produced using the temporarily holding member. Hereinafter, the method will be described.

Figure 35:
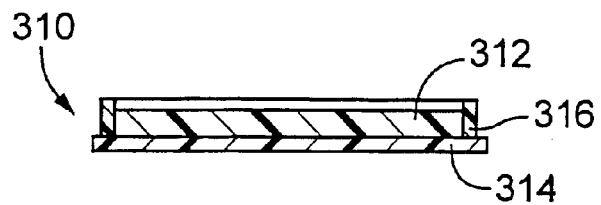
FIG. 35 is a view showing a step of another photovoltaic-panel producing method as another embodiment of the present invention and by which a photovoltaic panel is produced.

As shown in FIG. 35, a resin is supplied into a container 310 to form a light-transmitting layer 312 (this is a light-transmitting-layer forming step). The container 310 includes a bottom portion 314 and a frame portion 316, and the bottom portion 314 is formed of polycarbonate. The resin supplied to the container 310 is in a state before curing, e.g., in a gel (or half-solid) state in the present embodiment. However, the resin need not be in the gel state when the resin is supplied to the container 310, but may be in a liquid state. When photovoltaic elements 10 are embedded in the resin, the resin needs to be in the gel (or half-solid) state.

It is preferred that the light-transmitting layer 312 be formed of a material which is excellent with respect to light transmittance, weather resistance, electric insulation, chemical resistance, and heat resistance and is free of yellowing. In addition, preferably, the layer 312 is formed of a material which is excellent with respect to formability. For example, the layer 312 is preferably formed of a thermosetting resin, or a photocurable resin such as a resin which is cured by light such as ultraviolet rays. Since the container 310 is removed as described later, the container 310 need not be formed of a light-transmitting material.

Figure 36:
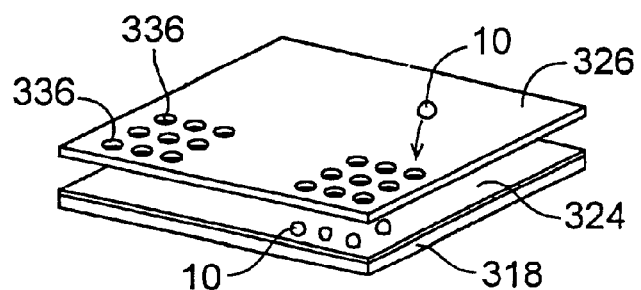
FIG. 36 is a view showing another step of the photovoltaic-panel producing method of FIG. 35.
Figure 37:
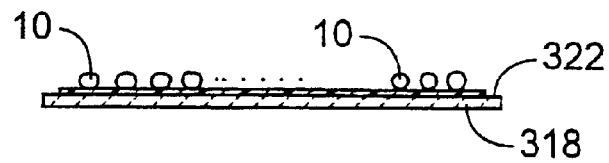
FIG. 37 is a view showing another step of the photovoltaic-panel producing method of FIG. 35.

Meanwhile, as shown in FIGS. 36 and 37, the photovoltaic elements 10 are temporarily held by a temporarily-holding plate 318 as a temporarily-holding member (this is a temporarily holding step). More specifically described, an adhesive is applied to a flat, temporarily-holding surface 322 of the temporarily-holding plate 318, so as to form an adhesive layer 324, and the photovoltaic elements 10 are temporarily held by the temporarily-holding plate 318, with the help of an arranging plate 326. Thus, the photovoltaic elements 10 are temporarily held by the adhesive layer 324.

In the present embodiment, the temporarily-holding plate 318 is formed of a glass plate and accordingly can transmit light. Since the light-transmitting layer 312 in the gel state is formed of a photocurable material which is cured by light such as ultraviolet rays, the layer 312 is irradiated with ultraviolet rays, or light containing ultraviolet rays, through the temporarily-holding plate 318. In the case where the container 310 is formed of a light-transmitting material, the layer 312 may be irradiated through the container 310. However, it is easier to irradiate the layer 312 through the plate 318, than through the container 310.

In the case where the light-transmitting layer 312 is formed of a thermosetting resin, it is preferred that the temporarily-holding plate 318 be formed of a material which is excellent with respect to heat transfer, so that heat can be effectively transferred to the layer 312 via the plate 318. In this case, the temporarily-holding plate 318 need not be able to transmit light. The temporarily-holding surface 322 of the temporarily-holding plate 318 need not be flat but may be curved. The temporarily-holding surface 322 may have a shape corresponding to that of a photovoltaic panel.

It is preferred that the adhesive used to form the adhesive layer 324 be one whose degree of adhesiveness to the photovoltaic elements 10 is lower than that of the light-transmitting layer 312. Thus, when the temporarily-holding plate 318 is removed, the photovoltaic elements 10 are prevented from coming off the light-transmitting layer 312, as will be described later.

The arranging plate 326 has a number of openings 336, as shown in FIG. 36, and the photovoltaic elements 10 fall, through the openings 336, onto respective predetermined positions on the adhesive layer 324 (or the temporarily-holding surface 322), and are temporarily adhered and held thereon.

Figure 38:
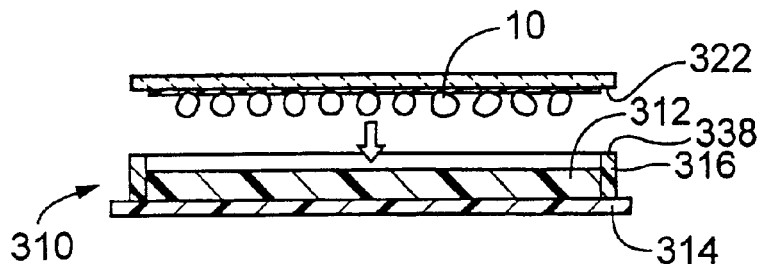
FIG. 38 is a view showing another step of the photovoltaic-panel producing method of FIG. 35.
Figure 39:
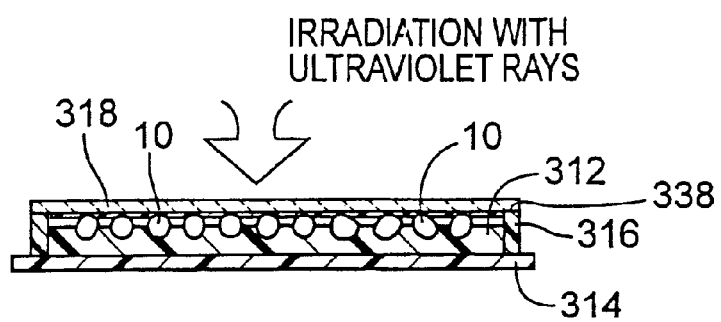
FIG. 39 is a view showing another step of the photovoltaic-panel producing method of FIG. 35.

Then, as shown in FIG. 38, the temporarily-holding plate 318 is moved toward, and pressed against, the light-transmitting layer 312 till about one half of each of the photovoltaic elements 10 is embedded in the layer 312 (this is a moving step or a pressing step). In this state, as shown in FIG. 39, the light-transmitting layer 312 is irradiated with ultraviolet rays, or light containing ultraviolet rays, through the temporarily-holding plate 318, so that the layer 312 is cured (this is a curing step).

The temporarily-holding plate 318 is moved, under pressure, toward the light-transmitting layer 312 till the temporarily-holding surface 322 thereof contacts an end surface 338 of the framework 316 of the container 310. In the present embodiment, as shown in FIG. 38, a holding surface 339 of the light-transmitting layer 312 present in the container 310 is somewhat lower than the end surface 338 of the framework 316. Thus, in the state in which the temporarily-holding surface 322 contacts the end surface 338 of the framework 316, somewhat more than a half of each of the photovoltaic elements 10 held by the temporarily-holding plate 318 is embedded in the layer 312. That is, the end surface 338 functions as a stopper which defines a limit of movement of the plate 318 toward the container 310. In addition, an amount of embedding of each photovoltaic element 10 in the layer 312 can be changed by changing a height position of the holding surface 339 relative to the end surface 338.

In the case where each photovoltaic element 10 has a generally spherical shape, if somewhat more than a half of each element 10 is embedded in the light-transmitting layer 312, about a half of each element 10 can be utilized to generate electric power, irrespective of whether the element 10 is irradiated with light through the light-transmitting layer 312, or not through the same 312. In addition, if somewhat more than a half of each element 10 is embedded in the layer 312, the each element 10 is firmly held by the layer 312.

Figure 40:
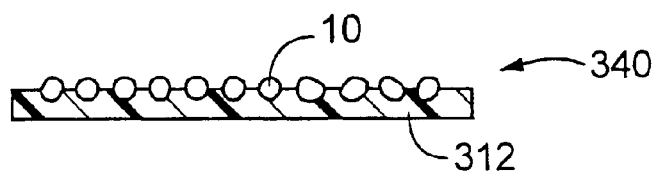
FIG. 40 is a view showing another step of the photovoltaic-panel producing method of FIG. 35, and a photovoltaic-element holding member.

Then, the temporarily-holding plate 318 and the container 310 are removed (this is a removing step), to provide a photovoltaic-element holding plate 340, shown in FIG. 40.

In the present embodiment, the container 310 is removed after the photovoltaic-element holding plate 340 is produced. However, the container 310 may be removed after a photovoltaic panel is produced. In the latter case, the container 310 is used as a protective member which protects the light-transmitting layer 312. For example, the container 310 can prevent metal from adhering to the layer 312, e.g., when electrode portions are formed, or prevent the layer 312 from being mechanically damaged during the producing steps.

The bottom portion 314 and the frame portion 316 of the container 310 may, or may not, be ones which transmit light. If those portions 314, 316 transmit light, those portions 314, 316 can be deemed as part of the light-transmitting layer 312 and need not be removed. In the latter case, a rigidity of the layer 312 is increased as such, and accordingly respective rigidities of the photovoltaic-element holding plate 340 and the photovoltaic panel are increased.

In another embodiment of the present embodiment, a photovoltaic-element holding plate is produced in a different method than the above-described method.

In the above-described method, the photovoltaic elements 10 are temporarily held, with the help of the arranging plate 326, by the adhesive layer 324 of the temporarily-holding plate 318, and those elements 10 are embedded in the light-transmitting layer 312 before curing, to produce the photovoltaic-element holding plate 340. In contrast thereto, in the present embodiment, first, a high density of photovoltaic elements 10 are temporarily held on an adhesive layer 454 provided on a temporarily-holding surface 452 of a temporarily-holding plate 450 which is formed of an elastic material such as rubber. Subsequently, the temporarily-holding plate 450 is elastically stretched in two directions perpendicular to each other, so as to produce respective appropriate spaces among the photovoltaic elements 10. Then, the photovoltaic elements 10 are embedded in the light-transmitting layer 312, to produce a photovoltaic-element holding plate 458.

Figure 41:
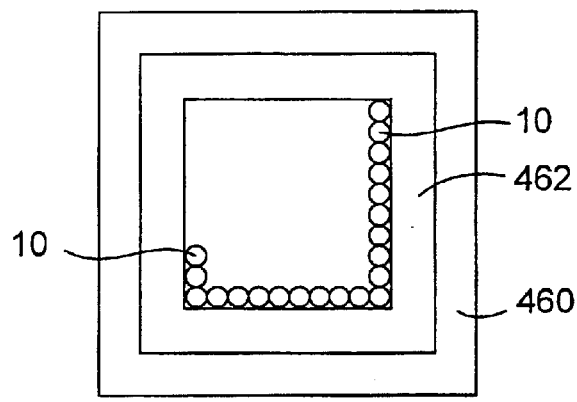
FIG. 41 is a view showing a step of another photovoltaic-panel producing method as another embodiment of the present invention and by which a photovoltaic panel is produced.
Figure 42:
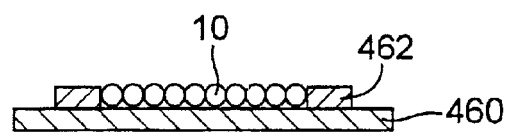
FIG. 42 is a view showing another step of the photovoltaic-panel producing method of FIG. 41.

More specifically described, as shown in FIGS. 41 and 42, the photovoltaic elements 10 are supplied into a container 464 including a bottom portion 460 and a side portion 462. For example, if the elements 10 are supplied while the container 464 is vibrated, respective spaces remaining among the elements 10 accommodated in the container 464 can be minimized.

Figure 43:
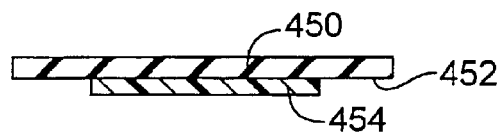
FIG. 43 is a view showing another step of the photovoltaic-panel producing method of FIG. 41.
Figure 44:
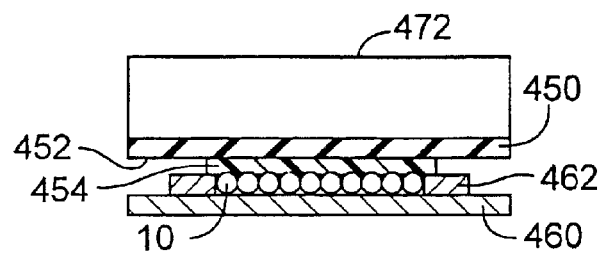
FIG. 44 is a view showing another step of the photovoltaic-panel producing method of FIG. 41.
Figure 45:
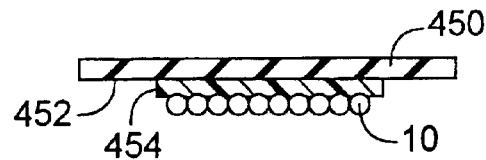
FIG. 45 is a view showing another step of the photovoltaic-panel producing method of FIG. 41.

Meanwhile, as shown in FIG. 43, the adhesive layer 454 is formed on the temporarily-holding surface 452 of the temporarily-holding plate 450. As shown in FIGS. 44 and 45, the adhesive layer 454 is pressed against the photovoltaic elements 10 arranged in the container 464, for example, using a pressing member 472. Since the temporarily-holding surface 452 of the temporarily-holding plate 450 contacts an upper surface of the side portion 462 of the container 464, the photoelectric elements 10 are prevented from receiving an excessively great force.

Figure 46:
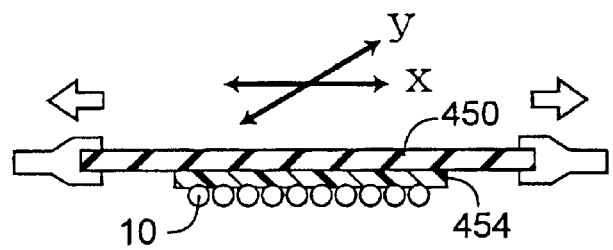
FIG. 46 is a view showing another step of the photovoltaic-panel producing method of FIG. 41.

Subsequently, as shown in FIG. 46, the temporarily-holding plate 450 is stretched, by a biaxial stretching machine, not shown, in two directions perpendicular to each other. Since the plate 450 is formed of an elastic material, the plate 450 can be stretched with a considerably small force, so as to produce respective appropriate spaces among the photovoltaic elements 10. The spaces produced among the elements 10 can be changed by changing an amount of the stretching by the stretching machine.

The temporarily-holding plate 450 is maintained in the stretched state. For example, the plate 450 is prevented from contracting, if a frame member is fitted in an outer peripheral portion of the plate 450 being stretched by the biaxial stretching machine.

Figure 47:
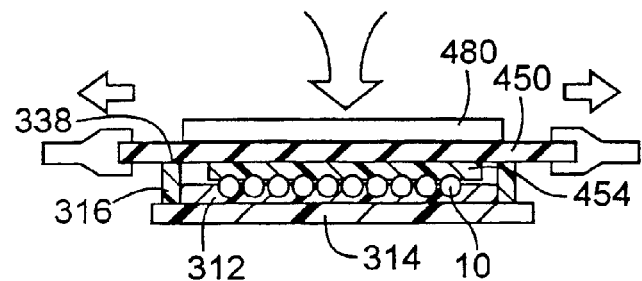
FIG. 47 is a view showing another step of the photovoltaic-panel producing method of FIG. 41.
Figure 48:
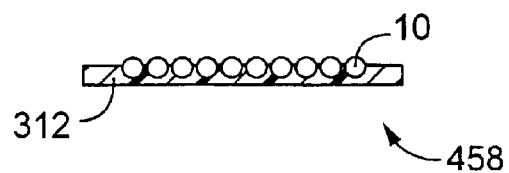
FIG. 48 is a view showing another step of the photovoltaic-panel producing method of FIG. 41, and a photovoltaic-element holding member.
Figure 49:
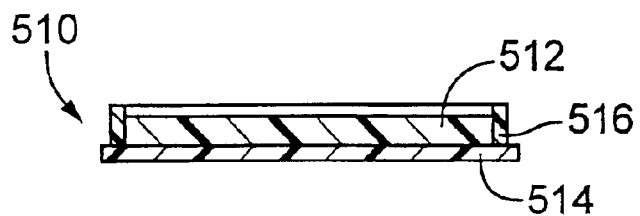
FIG. 49 is a view showing a step of another photovoltaic-panel producing method as another embodiment of the present invention and by which a photovoltaic panel is produced.

Then, as shown in FIGS. 47 and 48, the temporarily-holding plate 450 is moved toward the light-transmitting layer 312, like in the above-described method, so that the photovoltaic elements 10 are embedded in the layer 312. In the present embodiment, in the state in which the temporarily-holding surface 452 contacts, under pressure applied by a pressing member 480, the stopper surface 338, the layer 312 is irradiated with ultraviolet rays, or light containing ultraviolet rays, so as to produce the photovoltaic-element holding plate 458.

FIG. 47 shows that the light-transmitting layer 312 is irradiated with ultraviolet light that is incident from the side of the pressing member 480. However, if the pressing member 480 cannot transmit much light, the layer 312 may be irradiated with ultraviolet light that is incident from the side of the container 464.

Thus, in the present embodiment, the spaces among the photovoltaic elements 10, i.e., the respective positions of the elements 10 can be arbitrarily changed by changing the amount of stretching of the temporarily-holding plate 450. In addition, the density of the photovoltaic elements 10 held by the plate 450 can be adjusted. Moreover, since an arranging plate is not used, the density of the elements 10 can be increased, and accordingly the power-generating efficiency of the elements 10 can be increased. The photovoltaic elements 10 may not have a uniform shape. In the present embodiment, the density of the elements 10 of the photovoltaic-element holding member 458 can be increased even if the elements 10 may not have a uniform shape or size.

In the present embodiment, the temporarily-holding plate 450 is stretched in the two directions perpendicular to each other. However, it is possible to stretch the plate 450 in two directions which intersect each other to contain angles different from 90 degrees. Alternatively, it is possible to stretch the plate 450 in one direction only.

Next, there will be described another embodiment of the present invention that relates to a photovoltaic-panel producing method according to which a photovoltaic panel is produced. First, there will be described the step of forming a photovoltaic-element holding member.

As shown in FIG. 41, a resin is supplied into a container 510 to form a light-transmitting layer 512 (this is a light-transmitting-layer forming step). The container 510 includes a bottom portion 514 and a frame portion 516, and the bottom portion 514 is formed of polycarbonate. The resin supplied to the container 510 is in a state before curing, e.g., in a gel (or half-solid) state in the present embodiment. However, the resin need not be in the gel state when the resin is supplied to the container 510, but may be in a liquid state. When photovoltaic elements 520 are embedded in the resin, the resin needs to be in the gel (or half-solid) state.

It is preferred that the light-transmitting layer 512 be formed of a material which is excellent with respect to light transmittance, weather resistance, electric insulation, chemical resistance, and heat resistance and is free of yellowing. In addition, preferably, the layer 312 is formed of a material which is excellent with respect to formability. For example, the layer 512 is preferably formed of a thermosetting resin, or a photocurable resin such as a resin which is cured by light such as ultraviolet rays. Since the container 510 is removed as will be described later, the container 510 need not be formed of a light-transmitting material.

Figure 50:
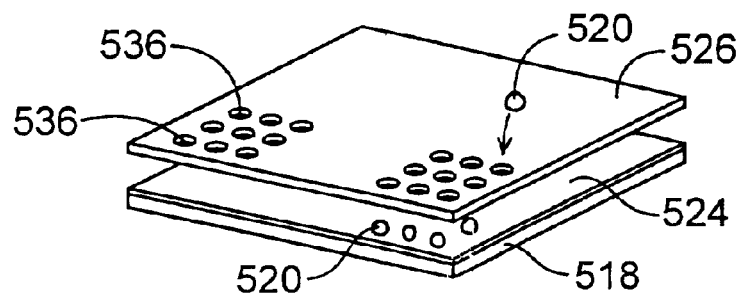
FIG. 50 is a view showing another step of the photovoltaic-panel producing method of FIG. 49.
Figure 51:
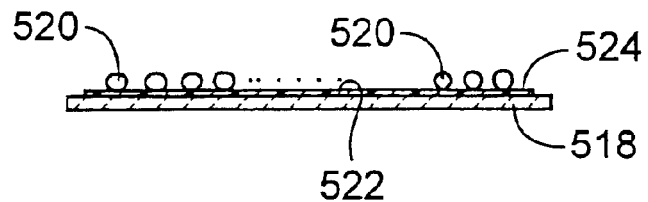
FIG. 51 is a view showing another step of the photovoltaic-panel producing method of FIG. 49.

Meanwhile, as shown in FIGS. 50 and 51, the photovoltaic elements 520 are temporarily held by a temporarily-holding plate 518 as a temporarily-holding member (this is a temporarily holding step). More specifically described, an adhesive is applied to a flat, temporarily-holding surface 522 of the temporarily-holding plate 518, so as to form an adhesive layer 524, and the photovoltaic elements 520 are temporarily held by the temporarily-holding plate 518, with the help of an arranging plate 526. Thus, the photovoltaic elements 520 are temporarily held by the adhesive layer 524.

Figure 54:
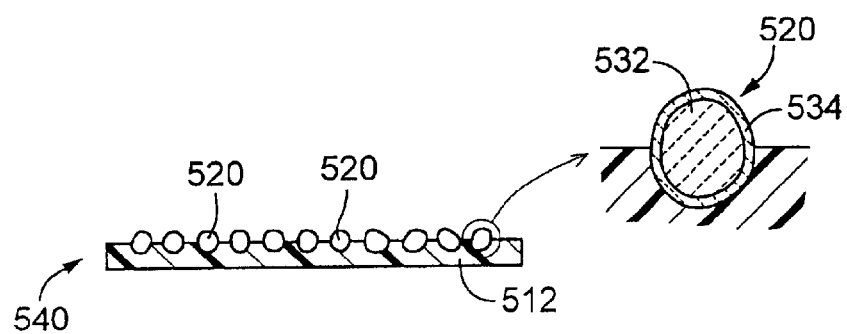
FIG. 54 is a view showing another step of the photovoltaic-panel producing method of FIG. 49.

As shown in FIG. 54, each of the photovoltaic elements 520 has a generally spherical shape, and includes a core portion 532 as a P-type layer, and a shell portion 534 as an N-type layer. The N-type layer 534 is formed by doping of the shell portion of a P-type silicon ball. However, each photovoltaic element 520 may not be a spherical one.

In the present embodiment, the temporarily-holding plate 518 is formed of a glass plate and accordingly can transmit light. Since the light-transmitting layer 512 in the gel state is formed of a photocurable material which is cured by light such as ultraviolet rays, the layer 512 is irradiated with ultraviolet rays, or light containing ultraviolet rays, through the temporarily-holding plate 518. In the case where the container 510 is formed of a light-transmitting material, the layer 512 may be irradiated through the container 510. However, it is easier to irradiate the layer 512 through the plate 518, than through the container 510.

In the case where the light-transmitting layer 512 is formed of a thermosetting resin, it is preferred that the temporarily-holding plate 518 be formed of a material which is excellent with respect to heat transfer, so that heat can be effectively transferred to the layer 512 via the plate 518. In this case, the temporarily-holding plate 518 need not be able to transmit light. The temporarily-holding surface 522 of the temporarily-holding plate 518 need not be flat or plane, but may be curved. That is, the temporarily-holding surface 522 (i.e., the shape of the temporarily-holding plate 518) can have a shape corresponding to that of a photovoltaic panel as an end product.

The adhesive used to form the adhesive layer 524 is one whose degree of adhesiveness to the photovoltaic elements 520 is lower than that of the light-transmitting layer 512. Thus, when the temporarily-holding plate 518 is removed, the photovoltaic elements 10 are prevented from coming off the light-transmitting layer 512, as will be described later.

The arranging plate 526 has a number of openings 536, as shown in FIG. 50, and the photovoltaic elements 520 fall, through the openings 536, onto respective predetermined positions on the adhesive layer 524 (or the temporarily-holding surface 522), and are temporarily adhered and held thereon.

Figure 52:
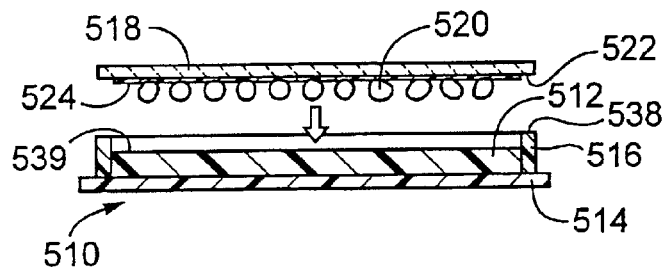
FIG. 52 is a view showing another step of the photovoltaic-panel producing method of FIG. 49.
Figure 53:
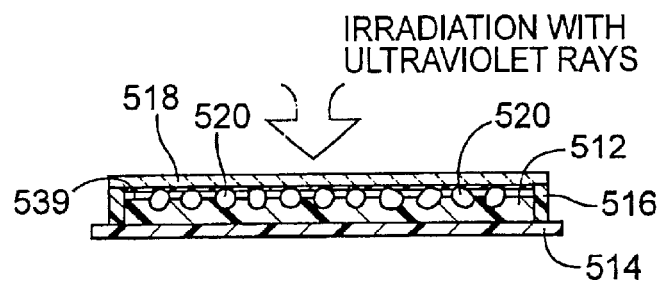
FIG. 53 is a view showing another step of the photovoltaic-panel producing method of FIG. 49.

Then, as shown in FIG. 52, the temporarily-holding plate 518 is moved toward, and pressed against, the light-transmitting layer 512 till about one half of each of the photovoltaic elements 520 is embedded in the layer 512 (this is a moving step or a pressing step). In this state, as shown in FIG. 53, the light-transmitting layer 512 is irradiated with ultraviolet rays, or light containing ultraviolet rays, through the temporarily-holding plate 518, so that the layer 512 is cured (this is a curing step).

The temporarily-holding plate 518 is moved, under pressure, toward the light-transmitting layer 512 till the temporarily-holding surface 522 thereof contacts an end surface 538 of the framework 516 of the container 510. In the present embodiment, as shown in FIG. 52, a holding surface 539 of the light-transmitting layer 512 present in the container 510 is somewhat lower than the end surface 538 of the framework 516. Thus, in the state in which the temporarily-holding surface 522 contacts the end surface 538 of the framework 516, somewhat more than a half of each of the photovoltaic elements 520 held by the temporarily-holding plate 518 is embedded in the layer 512. That is, the end surface 538 functions as a stopper which defines a limit of movement of the plate 518 toward the container 510. In addition, an amount or proportion of embedding of each photovoltaic element 520 in the layer 512 can be changed by changing a height position of the holding surface 539 relative to the end surface 538.

In the case where each photovoltaic element 520 has a generally spherical shape, if somewhat more than a half of each element 520 is embedded in the light-transmitting layer 512, about a half of each element 520 can be utilized to generate electric power, irrespective of whether the each element 10 is irradiated with light through the light-transmitting layer 512, or not through the same 512. In addition, in the case where somewhat more than a half of each element 520 is embedded in the layer 512, the each element 520 is firmly held by the layer 512.

Then, the temporarily-holding plate 518 and the bottom and frame portions 514, 516 are removed (this is a removing step), so as to provide a photovoltaic-element holding plate 540, shown in FIG. 54.

Next, there will be described an electrode-portion forming step in which electrode portions are formed on the thus obtained photovoltaic-element holding plate 540. In the present embodiment, both a P-type-layer electrode portion and an N-type-layer electrode portion are formed on one of opposite sides of the photovoltaic-element holding plate 540.

Figure 55:
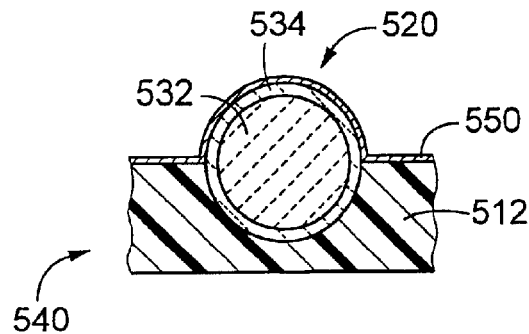
FIG. 55 is a view showing another step of the photovoltaic-panel producing method of FIG. 49.

As shown in FIG. 55, the N-type-layer electrode portion 550 is formed on the one side of the photovoltaic-element holding plate 540 on which the photovoltaic elements 520 project (this is an N-type-layer forming step). In the present embodiment, for example, the N-type-layer electrode portion 550 is formed by vapor deposition of an electrically conductive material such as aluminum, titan, or an alloy containing one or both of those metals.

Figure 56:
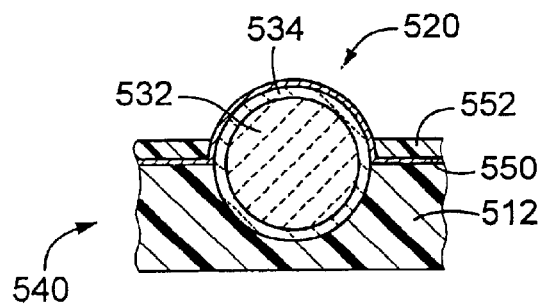
FIG. 56 is a view showing another step of the photovoltaic-panel producing method of FIG. 49.

Subsequently, as shown in FIG. 56, a protective layer 552 is formed to protect the N-type-layer electrode portion 550 (this is a protective-layer forming step). The protective layer 552 may be either electrically insulating or conductive. In the present embodiment, the protective layer 552 is formed of glass, resin, etc.

Figure 57:
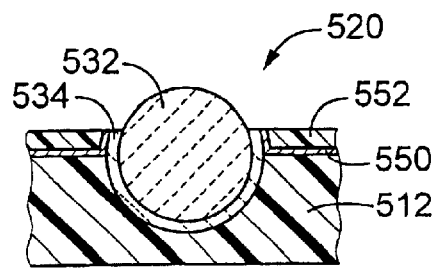
FIG. 57 is a view showing another step of the photovoltaic-panel producing method of FIG. 49.

As shown in FIG. 57, portions of the N-type-layer electrode portion 550 that correspond to locations where the P-type-layer electrode portion is to be formed, are removed (this is an N-type-layer-electrode-portion removing step). In the present embodiment, those portions of the electrode portion 550 are mechanically removed by, e.g., sand blasting in which small particles such as sand are blown against those portions. In the case where the protective layer 552 has been formed on the N-type-layer electrode portion 550, portions of the protective layer 552 that correspond to those portions of the electrode portion 550, are removed together therewith.

Next, the respective P-type layers 532 of the photovoltaic elements 520 are exposed by removing the respective N-type layers 534 by etching (this is an N-type-layer removing step or an etching step). A mixture of a hydrofluoric acid and a nitric acid is used as an etching liquid.

Figure 58:
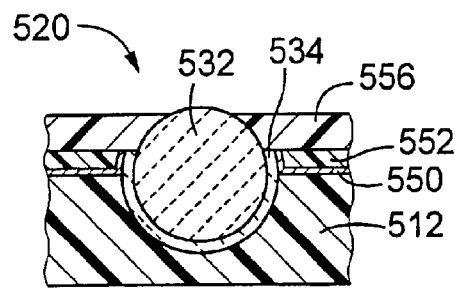
FIG. 58 is a view showing another step of the photovoltaic-panel producing method of FIG. 49.

As shown in FIG. 58, an electrically insulating layer 556 is formed (this is an electrically-insulating-layer forming step), to cover the respective N-type layers 534 and the first electrode portion 550.

Figure 59:
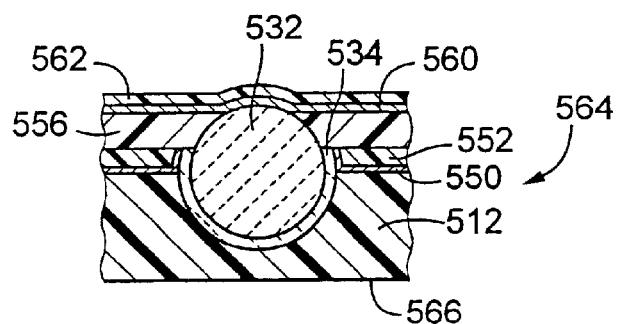
FIG. 59 is a view showing another step of the photovoltaic-panel producing method of FIG. 49.

Subsequently, as shown in FIG. 59, a P-type-layer electrode portion 560 is formed (this is a P-type-layer-electrode-portion forming step), and a protective layer 562 is formed (this is a protective-layer forming step). Thus, a photovoltaic panel 564 is obtained. Like the N-type-layer electrode portion 550, the P-type-layer electrode portion 560 is formed by vapor deposition. The photovoltaic panel 564 has a light receiving surface 566 on the opposite side of the panel 564 that is opposite to the one side thereof on which the electrode portions 550, 560 are formed.

As is apparent from the foregoing description of the present embodiment, the photovoltaic-element holding plate 540 is obtained by embedding the photovoltaic elements 520 in the light-transmitting layer 520 in the gel state. Since the resin is not applied to the photovoltaic elements 520, the plate 540 can be easily produced. In addition, since the temporarily-holding member 518 is used, the amount of projection of each photovoltaic element 520 from the light-transmitting layer 512 can be changed. Therefore, the amount of projection of each photovoltaic element 520 can be minimized while allowing the formation of the electrode portions 550, 560 and the insulating layer 556. Moreover, since the end surface 338 functions as the stopper, the respective amounts of projection of the photovoltaic elements 520 can be made equal to one another, irrespective of the respective sizes and shapes of the elements 520. In addition, since the two electrode portions 550, 560 are formed on one of the opposite sides of the photovoltaic-element holding plate 540, the area of the light receiving surface 566 present on the other side of the plate 540 is not reduced by the formation of the electrode portions 550, 560, and the light incident to the surface 566 can be effectively utilized.

In the present embodiment, the container 510 is removed after the photovoltaic-element holding plate 540 is produced. However, the container 510 may be removed after a photovoltaic panel 564 is produced. In the latter case, the container 510 is used as a protective member which protects the light-transmitting layer 512. For example, the container 510 can prevent metal from adhering to the layer 512, e.g., when the electrode portions 550, 560 are formed, or prevent the layer 512 from being mechanically damaged during the producing steps.

The bottom portion 514 and the frame portion 516 of the container 510 may, or may not, be ones which transmit light. If those portions 514, 516 transmit light, those portions 514, 516 can be deemed as part of the light-transmitting layer 512 and need not be removed. In the latter case, a rigidity of the layer 512 is increased as such, and accordingly respective rigidities of the photovoltaic-element holding plate 540 and the photovoltaic panel 564 are increased.

Figure 60:
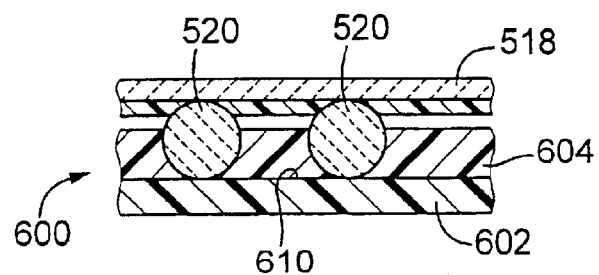
FIG. 60 is a view showing a step of another photovoltaic-panel producing method as another embodiment of the present invention and by which a photovoltaic panel is produced.

FIG. 60 shows another embodiment relating to an example of the above-indicated case. In the present embodiment, a light-transmitting layer 600 has a double-layer structure including a transparent plate member 602 and a light-transmitting resin layer 604. More specifically described, the light-transmitting resin layer 604 is formed, in a gel state, on one of opposite major surfaces of the transparent plate member 602. If the plate member 602 has some rigidity, the resin layer 604 need not be formed of a rigid material and accordingly a degree of freedom of choice of material is increased. In addition, if the transparent plate member 602 and the resin layer 604 are formed of a same material, a difference between respective refraction factors of the two elements 602, 604 can be reduced, and a dispersion thereof can be reduced.

In the present embodiment, the temporarily-holding member 518 is moved toward the light-transmitting layer 600 till the photovoltaic elements 520 contacts a plane surface 610 of the plate member 602. After the light-transmitting layer 600 is cured, the temporarily-holding member 518 is removed to provide a photovoltaic-element holding member. In this case, the plate member 602 is not removed any longer. When the light-transmitting layer 600 is formed, the plate member 602 functions as a support member which supports the resin layer 604; and after the formation of the layer 600, the plate member 602 functions as part of the light-transmitting layer 600.

Photovoltaic elements 520 may be embedded in a light-transmitting layer 600, by moving the layer 600 toward the elements 520 temporarily held by the temporarily-holding plate 518.

In addition, the N-type and P-type electrode portions 550, 560 may be formed in any manner, for example, CVD (chemical vapor deposition) such as chemical plating or electrolytic plating, or PVD (physical vapor deposition) such as spattering.

In another embodiment of the present embodiment, a photovoltaic-element holding plate is produced in a different method than the above-described methods shown in FIGS. 49 to 59 and FIG. 60.

In the method shown in FIGS. 49 to 59, the photovoltaic elements 520 are temporarily held, with the help of the arranging plate 526, by the adhesive layer 524 of the temporarily-holding plate 518, and those elements 520 are embedded in the light-transmitting layer 512 before curing, to produce the photovoltaic-element holding plate 540. In contrast thereto, in the present embodiment, first, photovoltaic elements 520 are temporarily held, without any spaces left thereamong, on an adhesive layer 654 provided on a temporarily-holding surface 652 of a temporarily-holding plate 650 which is formed of an elastic material such as rubber. Subsequently, the temporarily-holding plate 650 is elastically stretched in two directions perpendicular to each other, so as to produce respective appropriate spaces among the photovoltaic elements 520. Then, the photovoltaic elements 520 are embedded in the light-transmitting layer 512, to produce a photovoltaic-element holding plate 658.

Figure 61:
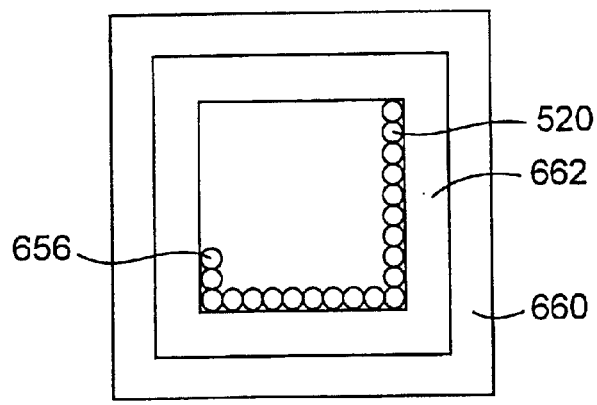
FIG. 61 is a view showing a step of another photovoltaic-panel producing method as another embodiment of the present invention and by which a photovoltaic panel is produced.
Figure 62:
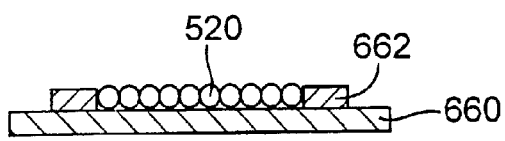
FIG. 62 is a view showing another step of the photovoltaic-panel producing method of FIG. 61.

More specifically described, as shown in FIGS. 61 and 62, the photovoltaic elements 520 are supplied into a container 664 including a bottom portion 660 and a side portion 662. For example, if the elements 520 are supplied while the container 664 is vibrated, the elements 10 are arranged, without any spaces left thereamong, in the container 664.

Figure 63:
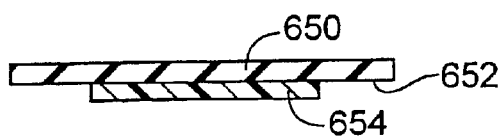
FIG. 63 is a view showing another step of the photovoltaic-panel producing method of FIG. 61.
Figure 64:
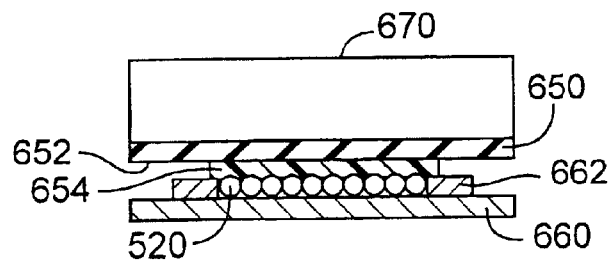
FIG. 64 is a view showing another step of the photovoltaic-panel producing method of FIG. 61.
Figure 65:
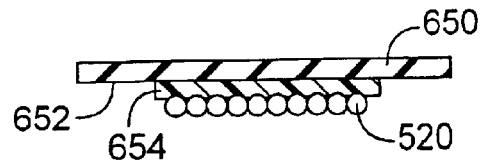
FIG. 65 is a view showing another step of the photovoltaic-panel producing method of FIG. 61.

Meanwhile, as shown in FIG. 63, the adhesive layer 654 is formed on the temporarily-holding surface 652 of the temporarily-holding plate 650. As shown in FIGS. 64 and 65, the adhesive layer 654 is pressed against the photovoltaic elements 520 arranged in the container 664, for example, using a pressing member 672. Since the temporarily-holding surface 652 of the temporarily-holding plate 650 contacts an upper surface of the side portion 662 of the container 664, the photoelectric elements 520 are prevented from receiving an excessively great force.

Figure 66:
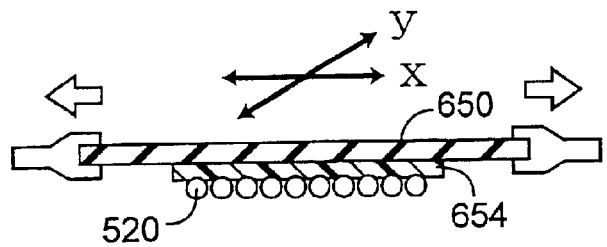
FIG. 66 is a view showing another step of the photovoltaic-panel producing method of FIG. 61.

Subsequently, as shown in FIG. 66, the temporarily-holding plate 650 is stretched, by a biaxial stretching machine, not shown, in two directions perpendicular to each other. Since the plate 650 is formed of an elastic material, the plate 650 can be stretched with a considerably small force, so as to produce respective appropriate spaces among the photovoltaic elements 520. The spaces produced among the elements 520 can be changed by changing an amount of the stretching by the stretching machine.

The temporarily-holding plate 650 is maintained in the stretched state. For example, the plate 650 is prevented from contracting, if a frame member is fitted in an outer peripheral portion of the plate 650 being stretched by the biaxial stretching machine.

Figure 67:
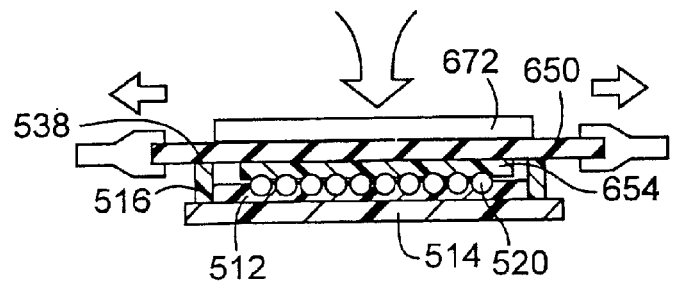
FIG. 67 is a view showing another step of the photovoltaic-panel producing method of FIG. 61.
Figure 68:
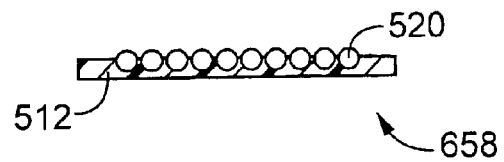
FIG. 68 is a view showing another step of the photovoltaic-panel producing method of FIG. 61.

Then, as shown in FIGS. 67 and 68, the temporarily-holding plate 650 is moved toward the light-transmitting layer 512, like in the above-described methods, so that the photovoltaic elements 520 are embedded in the layer 512. In the present embodiment, in the state in which the temporarily-holding surface 652 contacts, under pressure applied by the pressing member 672, the stopper surface 538, the layer 512 is irradiated with ultraviolet rays, or light containing ultraviolet rays (i.e., ultraviolet light), so as to produce the photovoltaic-element holding plate 658.

FIG. 67 shows that the light-transmitting layer 512 is irradiated with ultraviolet rays, or light containing ultraviolet rays, that are applied from the side of the pressing member 672. However, if the pressing member 672 is formed of a material which cannot easily transmit the ultraviolet rays, the layer 512 may be irradiated with the rays or the light that is applied from the side of the bottom portion 660 of the container 664.

Thus, in the present embodiment, the spaces among the photovoltaic elements 520, i.e., the respective positions of the elements 520 can be arbitrarily changed by changing the amount or proportion of stretching of the temporarily-holding plate 650. In addition, the density of the photovoltaic elements 520 held by the plate 650 can be adjusted. Moreover, since the arranging plate 526 is not used, the density of the elements 520 can be increased, and accordingly the power-generating efficiency of the elements 520 can be increased. The photovoltaic elements 520 may not have a uniform shape. In the present embodiment, the density of the elements 520 of the photovoltaic-element holding member 658 can be increased even if the elements 520 may not have a uniform shape or size.

In each of the three embodiments shown in FIGS. 49 to 59, FIG. 60, and FIGS. 61–68, the N-type and P-type electrode portions 550, 560 are formed on one of the opposite sides of the photovoltaic-element holding member 540, 658. However, N-type and P-type electrode portions may be formed on opposite sides of a photovoltaic-element holding member, respectively.

Figure 69:
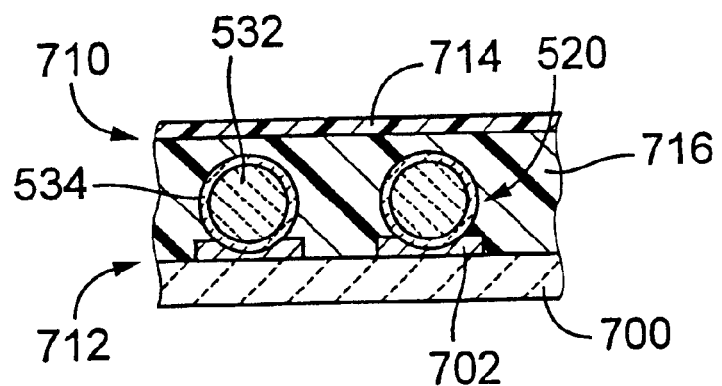
FIG. 69 is a view showing a step of another photovoltaic-panel producing method as another embodiment of the present invention and by which a photovoltaic panel is produced.
Figure 70:
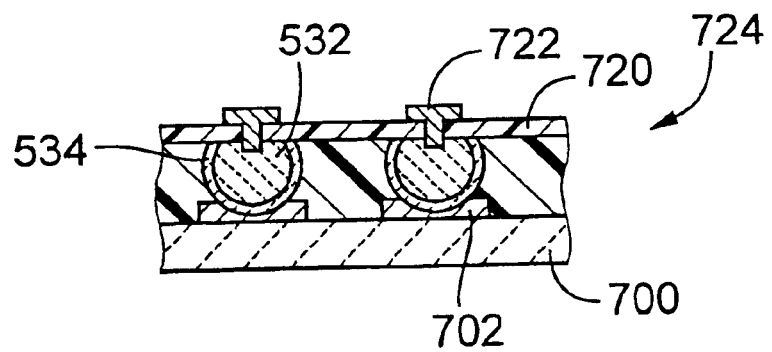
FIG. 70 is a view showing another step of the photovoltaic-panel producing method of FIG. 69.

FIGS. 69 and 70 show another embodiment in which N-type and P-type electrode portions are formed on opposite sides of a photovoltaic-element holding member, respectively. First, photovoltaic elements 520 are fixed to a support plate 700 via an N-type-layer electrode portion 702 (this is an N-type-layer-electrode-portion forming step). More specifically described, in a state in which the photovoltaic elements 520 are held in contact with the N-type-layer electrode portion 702, the elements 520 and the electrode portion 702 are heated so that the elements 520 are electrically connected to the electrode portion 702. Subsequently, a light-transmitting layer 710 is moved toward the support plate 700 to which the photovoltaic elements 520 are fixed, so that the electrodes 520 are embedded in the layer 710 and thus a photovoltaic-element holding member 712 is produced. The light-transmitting layer 710 includes a plate member 714, and a resin layer 716 in a gel state. It is preferred that the resin layer 716 have a higher viscosity than that of the light-transmitting layer 512 employed in the above-described embodiments. Thus, in the present embodiment, the N-type-layer-electrode-portion forming step precedes the photovoltaic-element-holding-member producing step.

Subsequently, a portion of the light-transmitting layer 710 is removed with respective portions of the photovoltaic elements 520, and an electrically insulating layer 720 is formed (this is an insulating-layer forming step). Then, respective portions of the insulating layer 720 that correspond to the respective P-type layers 532 of the photovoltaic elements 520 are removed, and a P-type-layer electrode portion 722 is formed (this is a P-type-layer-electrode-portion forming step). Thus, the two electrode portions 702, 722 are formed on the opposite sides of the photovoltaic-element holding member 712, respectively, to provide a photovoltaic panel 724.

In each of all the embodiments shown in FIGS. 1 to 70, each photovoltaic element 10, 520 may be provided by a silicon ball including a shell portion as a P-type layer and a core portion as an N-type layer, or a silicon ball additionally including an I-type layer between P-type and N-type layers. In addition, each photovoltaic element 10, 520 is not limited to a generally spherical member, but may be provided by a granular or tubular member that includes an outer layer as one of P-type and N-type layers and an inner layer as the other of P-type and N-type layers. Each photovoltaic element 10, 520 is not limited to any specific shape, so long as it includes P-type and N-type layers. Moreover, the amount of embedding of each photovoltaic element 10, 520 in the holding layer 204, 202 or the light-transmitting layer 512, 600, 710 may be less than a half of the each element 10, 520.

It is to be understood that the present invention may be embodied with other improvements, such as those described in SUMMARY OF THE INVENTION, which may occur to a person skilled in the art, without departing from the spirit and scope of the invention defined in the appended claims.

What is claimed is:

1. A method of producing a photovoltaic panel, comprising the steps of:
   producing a light-transmitting, photovoltaic-element holding member which holds, along a reference surface, a plurality of photovoltaic elements each of which includes a P-type layer and an N-type layer, and
   forming, on one of opposite sides of the photovoltaic-element holding member, a first electrode which is electrically connected to the respective P-type layers of the photovoltaic elements, and a second electrode which is electrically connected to the respective N-type layers of the photovoltaic elements,
   wherein the step of producing comprises
      forming a light-transmitting layer of a light-transmitting material before curing,
      embedding at least respective portions of the photovoltaic elements in the light-transmitting layer, and
      curing the light-transmitting layer in a state in which said at least respective portions of the photovoltaic elements are embedded in the light-transmitting layer,
   wherein the step of embedding comprises
      temporarily holding, with a temporarily-holding surface of a temporarily-holding member the photovoltaic elements, and
      moving the temporarily-holding member holding the photovoltaic elements, toward the light-transmitting layer, till the respective portions of the photovoltaic elements are embedded in the light-transmitting layer.

2. A method according to claim 1, wherein the step of moving comprises pressing, in a state in which the photovoltaic elements contact the light-transmitting layer, the temporarily-holding member and the light-transmitting layer against each other.

3. A method of producing a photovoltaic panel, comprising the steps of:
   producing a light-transmitting, photovoltaic-element holding member which holds, along a reference surface, a plurality of photovoltaic elements each of which includes a P-type layer and an N-type layer, and
   forming, on one of opposite sides of the photovoltaic-element holding member, a first electrode which is electrically connected to the respective P-type layers of the photovoltaic elements, and a second electrode which is electrically connected to the respective N-type layers of the photovoltaic elements,
   wherein the step of producing comprises
      forming a light-transmitting layer of a first light-transmitting material before curing,
      embedding at least respective portions of the photovoltaic elements in the light-transmitting layer, and
      curing the light-transmitting layer in a state in which said at least respective portions of the photovoltaic elements are embedded in the light-transmitting layer, and
   wherein the step of forming the light-transmitting layer comprises
      preparing a container including a bottom portion and a frame portion projecting from an outer periphery of the bottom portion, and
      supplying the first light-transmitting material to the container and thereby forming the light-transmitting layer.

4. A method of producing a photovoltaic panel, comprising the steps of:
   producing a light-transmitting, photovoltaic-element holding member which holds, along a reference surface, a plurality of photovoltaic elements each of which includes a P-type layer and an N-type layer, and
   forming, on one of opposite sides of the photovoltaic-element holding member, a first electrode which is electrically connected to the respective P-type layers of the photovoltaic elements, and a second electrode which is electrically connected to the respective N-type layers of the photovoltaic elements,
   wherein the step of producing comprises
      arranging, according to a rule, a plurality of transparent spherical members, along a reference plane, and
      holding, with the arranged spherical members, the photovoltaic elements, such that the photovoltaic elements are positioned on the spherical members.

5. A method according to claim 1, wherein the temporarily-holding member is formed of an elastic material, and wherein the step of temporarily holding comprises stretching the temporarily-holding member holding the photovoltaic elements, to change a space between each pair of adjacent photovoltaic elements of said plurality of photovoltaic elements.

6. A photovoltaic panel, comprising:
   a plurality of transparent spherical members which are arranged, according to a rule, along a reference plane;
   a plurality of photovoltaic elements each of which includes a P-type layer and an N-type layer and which are held by the arranged spherical members, such that the photovoltaic elements are positioned on the spherical members;
   a first electrode which is provided on one of opposite sides of a first plane intersecting the photovoltaic elements and which is electrically connected to the respective P-type layers of the photovoltaic elements;
   a second electrode which is provided on said one of the opposite sides of the first plane and which is electrically connected to the respective N-type layers of the photovoltaic elements; and
   a light-transmitting layer which is formed of a light-transmitting material and which is provided on the other side of the first plane where the transparent spherical members are provided and which fills at least a space between the first plane and a second plane which is parallel to the first plane and is tangent to the photovoltaic elements.

7. A photovoltaic panel according to claim 6, wherein the first plane divides each of the photovoltaic elements into a first portion whose volume is smaller than 50% of a volume of said each photovoltaic element, and a second portion whose volume is greater than 50% of the volume, and wherein the light-transmitting layer is provided on the other side of the first plane on which the respective second portions of the photovoltaic elements are located.

8. A photovoltaic panel according to claim 6, wherein the light-transmitting layer has a shape having two plane surfaces parallel to each other, and wherein one of the two plane surfaces is substantially parallel to the first plane and the other plane surface is substantially parallel to the second plane.

9. A method of producing a photovoltaic panel, comprising the steps of:

producing a light-transmitting, photovoltaic-element holding member which holds a plurality of photovoltaic elements along a reference surface, and forming at least one electrode which is electrically connected to the photovoltaic elements held by the photovoltaic-element holding member, wherein the step of producing comprises forming a light-transmitting layer of a light-transmitting material before curing, embedding at least respective portions of the photovoltaic elements in the light-transmitting layer, and curing the light-transmitting layer in a state in which said at least respective portions of the photovoltaic elements are embedded in the light-transmitting layer, and wherein the step of embedding comprises temporarily holding, with a temporarily-holding surface of a temporarily-holding member, the photovoltaic elements, and moving the temporarily-holding member holding the photovoltaic elements, toward the light-transmitting layer, till the respective portions of the photovoltaic elements are embedded in the light-transmitting layer.

10. A method according to claim 9, wherein the step of embedding comprises embedding more than 50% of a volume of each of the photovoltaic elements, in the light-transmitting layer.

11. A method according to claim 9, wherein the step of embedding comprises embedding more than 50% of an area of junction of a P-type layer and an N-type layer of each of the photovoltaic elements, in the light-transmitting layer.

12. A method according to claim 9, wherein the step of temporarily holding comprises temporarily fixing the photovoltaic elements to an adhesive layer which is formed on the temporarily-holding surface of the temporarily-holding member.

13. A method according to claim 9, wherein the step of temporarily holding comprises temporarily holding, with an arranging member, the photovoltaic elements on the temporarily-holding surface of the temporarily-holding member.

14. A method according to claim 9, wherein the temporarily-holding member is formed of an elastic material, and wherein the step of temporarily holding comprises stretching the temporarily-holding member holding the photovoltaic elements, to change a space between each pair of adjacent photovoltaic elements of said plurality of photovoltaic elements.

15. A method according to claim 14, wherein the step of moving the temporarily-holding member comprises moving the temporarily-holding member toward the light-transmitting layer, while preventing contraction of the temporarily-holding member stretched.

16. A method according to claim 9, wherein the step of temporarily holding comprises arranging, in a container, the photovoltaic elements into a single layer such that the photovoltaic elements contact with each other, and pressing the temporarily-holding member against the photovoltaic elements arranged in the single layer in the container.

17. A method according to claim 9, wherein the step of moving comprises pressing, in a state in which the photovoltaic elements contact the light-transmitting layer, the temporarily-holding member and the light-transmitting layer against each other.

18. A method according to claim 9, wherein the step of producing further comprises removing, after the step of curing, the temporarily-holding member from the cured light-transmitting layer.

19. A method according to claim 9, wherein the step of forming the light-transmitting layer comprises supplying the light-transmitting material to a container and thereby forming the light-transmitting layer.

20. A method according to claim 9, wherein the step of forming said at least one electrode comprises forming two electrodes on one of opposite sides of the photovoltaic-element holding member.

21. A method according to claim 9, wherein the step of forming said at least one electrode comprises forming two electrodes on opposite sides of the photovoltaic-element holding member, respectively.

22. A method according to claim 3, wherein the step of preparing the container comprises forming at least a portion of the container of a second light-transmitting material.

23. A photovoltaic panel, comprising:

a plurality of photovoltaic elements each of which includes a P-type layer and an N-type layer;

a first electrode which is provided on one of opposite sides of a first plane intersecting the photovoltaic elements and which is electrically connected to the respective P-type layers of the photovoltaic elements;

a second electrode which is provided on said one of the opposite sides of the first plane and which is electrically connected to the respective N-type layers of the photovoltaic elements;

a first light-transmitting layer which is farmed of a light-transmitting material and which is provided on the other side of the first plane and which fills a space between the first plane and a second plane which is parallel to the first plane and is tangent to the photovoltaic elements; and a second light-transmitting layer which is provided on one of opposite sides of the second plane that is opposite to the other side thereof on which the first light-transmitting layer is provided, the second light-transmitting layer defining the second plane.

24. A photovoltaic panel according to claim 23, wherein the second light-transmitting layer comprises a rigid, flat member.

* * * * *